US012610609B2

(12) United States Patent
Liao et al.

(10) Patent No.: US 12,610,609 B2
(45) Date of Patent: Apr. 21, 2026

(54) METHOD OF FORMING FinFET WITH PROTECTED LOW-k GATE SPACERS

(71) Applicant: Taiwan Semiconductor Manufacturing Co., Ltd., Hsinchu (TW)

(72) Inventors: Shu Ling Liao, Taichung City (TW); Chung-Chi Ko, Nantou (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/416,069

(22) Filed: Jan. 18, 2024

(65) Prior Publication Data

US 2024/0153828 A1    May 9, 2024

Related U.S. Application Data

(60) Continuation of application No. 17/333,116, filed on May 28, 2021, now Pat. No. 11,908,750, which is a
(Continued)

(51) Int. Cl.
H10D 84/03 (2025.01)
H01L 21/28 (2006.01)
(Continued)

(52) U.S. Cl.
CPC ..... H10D 84/038 (2025.01); H01L 21/28123 (2013.01); H10D 30/797 (2025.01);
(Continued)

(58) Field of Classification Search
CPC .. H10D 84/038; H10D 30/797; H10D 62/021; H10D 62/116; H10D 62/151; H10D 64/017; H10D 64/021; H10D 64/671; H10D 84/017; H10D 84/0184; H10D 84/0193; H10D 84/853; H10D 30/024; H10D 30/62; H10D 30/6219; H10D 64/015; H10D 62/822; H10D 84/0147; H10D 84/0151; H10D 84/834; H10D 30/792;
(Continued)

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |

(Continued)

FOREIGN PATENT DOCUMENTS

| | | | |
|---|---|---|---|
| CN | 103137657 A | 6/2013 | |
| CN | 103383918 A | 11/2013 | |

(Continued)

*Primary Examiner* — Tan N Tran
(74) *Attorney, Agent, or Firm* — Slater Matsil, LLP

(57) ABSTRACT

An embodiment is a device including a first fin extending from a substrate, a first gate stack over and along sidewalls of the first fin, a first gate spacer disposed along a sidewall of the first gate stack, a first epitaxial source/drain region in the first fin and adjacent the first gate spacer, the first epitaxial source/drain region, and a protection layer between the first epitaxial source/drain region and the first gate spacer and between the first gate spacer and the first gate stack.

20 Claims, 37 Drawing Sheets

Related U.S. Application Data division of application No. 16/276,308, filed on Feb. 14, 2019, now Pat. No. 11,024,550.

(60) Provisional application No. 62/764,865, filed on Aug. 16, 2018.

(51) Int. Cl.

| | |
|---|---|
| *H10D 30/69* | (2025.01) |
| *H10D 62/00* | (2025.01) |
| *H10D 62/10* | (2025.01) |
| *H10D 62/13* | (2025.01) |
| *H10D 64/01* | (2025.01) |
| *H10D 64/66* | (2025.01) |
| *H10D 84/01* | (2025.01) |
| *H10D 84/85* | (2025.01) |

(52) U.S. Cl.

CPC ......... *H10D 62/021* (2025.01); *H10D 62/116* (2025.01); *H10D 62/151* (2025.01); *H10D 64/017* (2025.01); *H10D 64/021* (2025.01); *H10D 64/671* (2025.01); *H10D 84/017* (2025.01); *H10D 84/0184* (2025.01); *H10D 84/0193* (2025.01); *H10D 84/853* (2025.01)

(58) Field of Classification Search

CPC ............ H10D 84/0144; H10D 84/0158; H01L 21/28123; H01L 21/02126; H01L 21/02293; H01L 21/31105; H01L 21/76829

See application file for complete search history.

(56) References Cited

U.S. PATENT DOCUMENTS

| | | | |
|---|---|---|---|
| 9,236,267 | B2 | 1/2016 | De et al. |
| 9,245,805 | B2 | 1/2016 | Yeh et al. |
| 9,318,367 | B2 | 4/2016 | Huang et al. |
| 9,401,416 | B2 | 7/2016 | Yu et al. |
| 9,418,897 | B1 | 8/2016 | Ching et al. |
| 9,484,346 | B2 | 11/2016 | Chen |
| 9,520,482 | B1 | 12/2016 | Chang et al. |
| 9,576,814 | B2 | 2/2017 | Wu et al. |
| 9,608,116 | B2 | 3/2017 | Ching et al. |
| 9,685,533 | B1 | 6/2017 | Kuo et al. |
| 9,741,615 | B1 * | 8/2017 | Zang .................. H10D 84/0149 |
| 9,812,363 | B1 | 11/2017 | Liao et al. |
| 9,859,380 | B2 | 1/2018 | Lee et al. |
| 9,947,766 | B2 * | 4/2018 | Chiang ............... H10D 64/258 |
| 10,374,090 | B2 | 8/2019 | Ontalus |
| 10,395,991 | B2 | 8/2019 | Hsu et al. |
| 10,529,573 | B2 | 1/2020 | Ando et al. |
| 10,685,957 | B2 * | 6/2020 | Choi .................. H01L 21/02636 |
| 10,790,148 | B2 | 9/2020 | Niebojewski et al. |
| 2007/0034906 | A1 | 2/2007 | Wang et al. |
| 2011/0198675 | A1 | 8/2011 | Ng et al. |
| 2012/0241868 | A1 | 9/2012 | Tsai et al. |
| 2014/0239404 | A1 | 8/2014 | Hung et al. |
| 2015/0145066 | A1 | 5/2015 | Lu et al. |
| 2015/0187897 | A1 | 7/2015 | Guo et al. |
| 2016/0099342 | A1 | 4/2016 | Basker et al. |
| 2016/0141381 | A1 | 5/2016 | Kim et al. |
| 2017/0148914 | A1 | 5/2017 | Lee et al. |
| 2017/0243952 | A1 | 8/2017 | Kuo et al. |
| 2017/0317213 | A1 * | 11/2017 | Park .................. H01L 21/0217 |
| 2018/0190785 | A1 | 7/2018 | Hung et al. |
| 2018/0233369 | A1 * | 8/2018 | Ando .................. H10D 64/667 |

FOREIGN PATENT DOCUMENTS

| | | |
|---|---|---|
| CN | 104282568 A | 1/2015 |
| CN | 106158860 A | 11/2016 |
| CN | 106876273 A | 6/2017 |
| CN | 108122850 A | 6/2018 |
| KR | 20150061607 A | 6/2015 |
| KR | 20160059861 A | 5/2016 |
| KR | 20170061233 A | 6/2017 |

* cited by examiner

METHOD OF FORMING FinFET WITH PROTECTED LOW-k GATE SPACERS

PRIORITY CLAIM AND CROSS-REFERENCE

This application is a continuation of U.S. patent application Ser. No. 17/333,116, filed May 28, 2021, entitled "Semiconductor Device and Method," which is a divisional of U.S. patent application Ser. No. 16/276,308, filed Feb. 14, 2019, entitled "Semiconductor Device and Method", (now U.S. Pat. No. 11,024,550, issued Jun. 1, 2021), which claims the benefit of U.S. Provisional Application No. 62/764,865, filed on Aug. 16, 2018, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
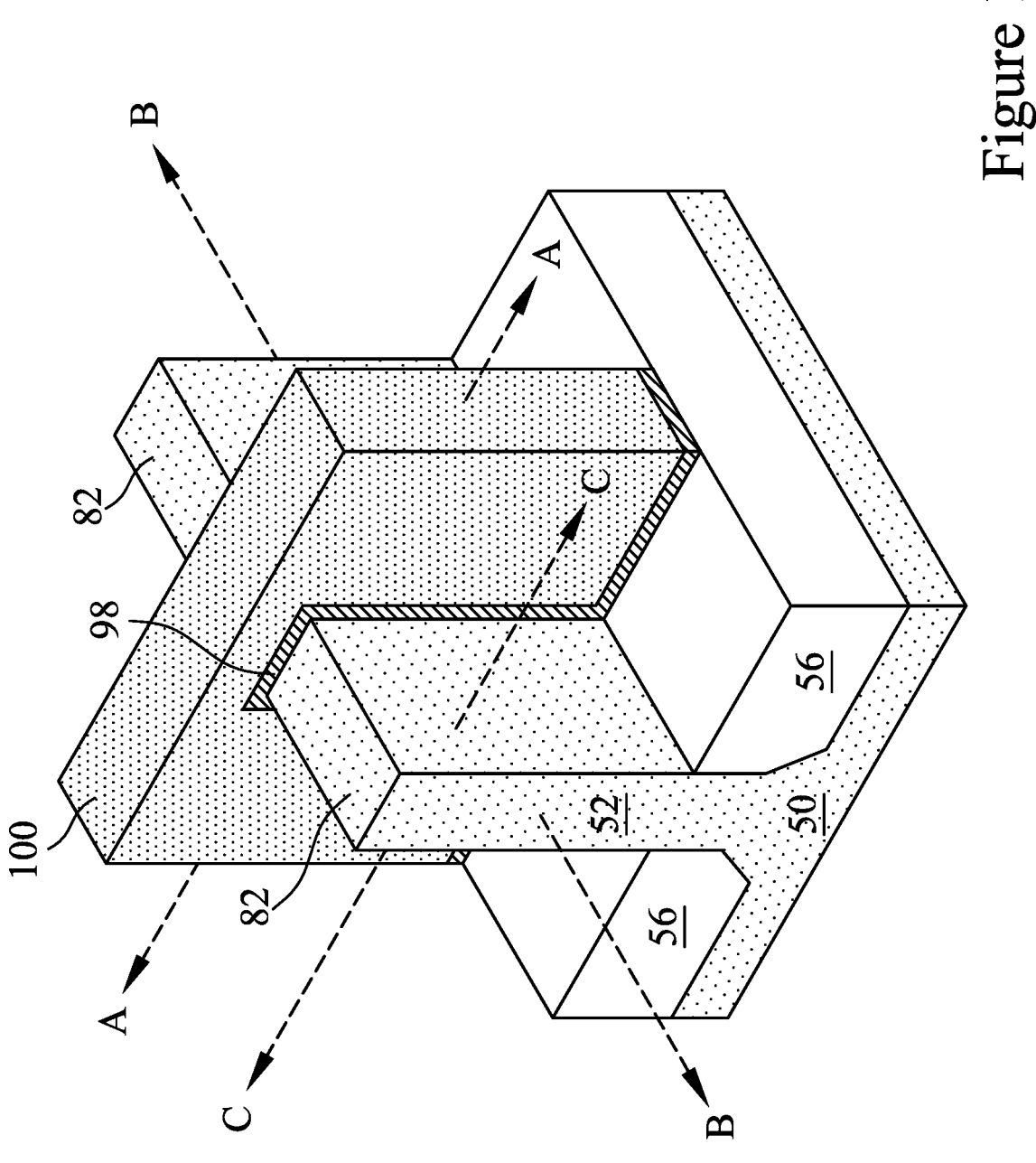
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last (sometimes referred to as replacement gate process) process. In other embodiments, a gate-first process may be used. Some variations of the embodiments are discussed. Also, some embodiments contemplate aspects used in planar devices, such as planar FETs. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Before addressing the illustrated embodiments specifically, certain advantageous features and aspects of the present disclosed embodiments will be addressed generally. In general terms, the present disclosure is a semiconductor device and method of forming the same to improve the performance of FinFET devices by reducing the capacitance between the gate and the source/drain regions of the devices while not causing damage to the source/drain regions. In the disclosed embodiments, the source/drain regions are epitaxial structures and the spacers formed on sidewalls of the gate electrodes are formed as low-k spacers to reduce the capacitance between the gate electrodes and the source/drain regions. In some embodiments, the method of forming the low-k spacers utilizes a protection layer to protect the source/drain region and prevent it from being damaged during the formation of the low-k spacers. In some embodiments, the gate spacers are formed as air spacers (e.g., a void or gap between the gate electrode and the source/drain region) to lower the k value of the space between gate electrode and the source/drain region. The disclosed processes and structures can improve the performance, reliability, and yield of the FinFET device.

Some embodiments contemplate both n-type devices, such as n-type FinFETs, and p-type devices, such as p-type FinFETs, being manufactured during a manufacturing process. Hence, some embodiments contemplate the formation of complementary devices. Figures below may illustrate one device, but one of ordinary skill in the art will readily understand that multiple devices, some with a different device type, can be formed during processing. Some aspects of the formation of complementary devices are discussed below, although such aspects may not necessarily be illustrated in the figures.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 98 is along sidewalls and over a top surface of the fin 52, and a gate electrode 100 is over the gate dielectric layer 98. Source/drain regions 82 are disposed in opposite sides of the fin 52 with respect to the gate dielectric layer 98 and gate electrode 100. FIG. 1 further illustrates reference cross-sections that are used in later figures. Cross-section A-A is along a longitudinal axis of the gate electrode 100 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 20B are cross-sectional views of intermediate stages in the manufacturing of FinFETs, in accordance with some embodiments. FIGS. 2 through 7 illustrate reference cross-section A-A illustrated in FIG. 1, except for multiple fins/gates/FinFETs. Figures ending in A (e.g., FIGS. 8A, 9A, 10A, etc.), are illustrated along reference cross-section A-A illustrated in FIG. 1, and figures ending in B (e.g., FIGS. 8B, 9B, 10B, etc.) are illustrated along a similar cross-section B-B illustrated in FIG. 1, except for multiple fins/gates/FinFETs. FIGS. 10C and 10D are illustrated along reference cross-section C-C illustrated in FIG. 1, except for multiple fins/gates/FinFETs.

Figure 2:
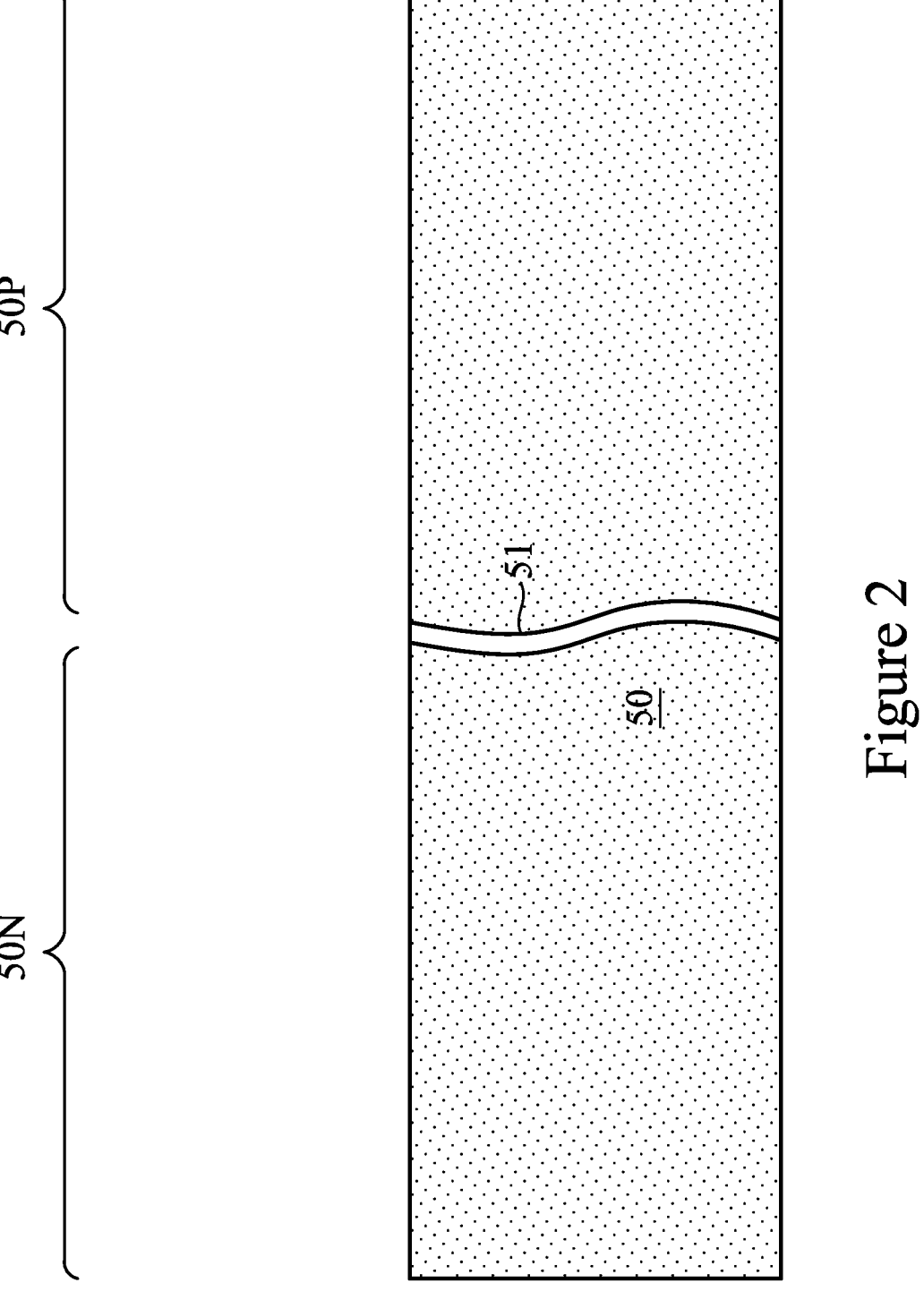
FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, 16B, 17A, 17B, 18A, 18B, 18C, 19A, 19B, 20A, and 20B are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
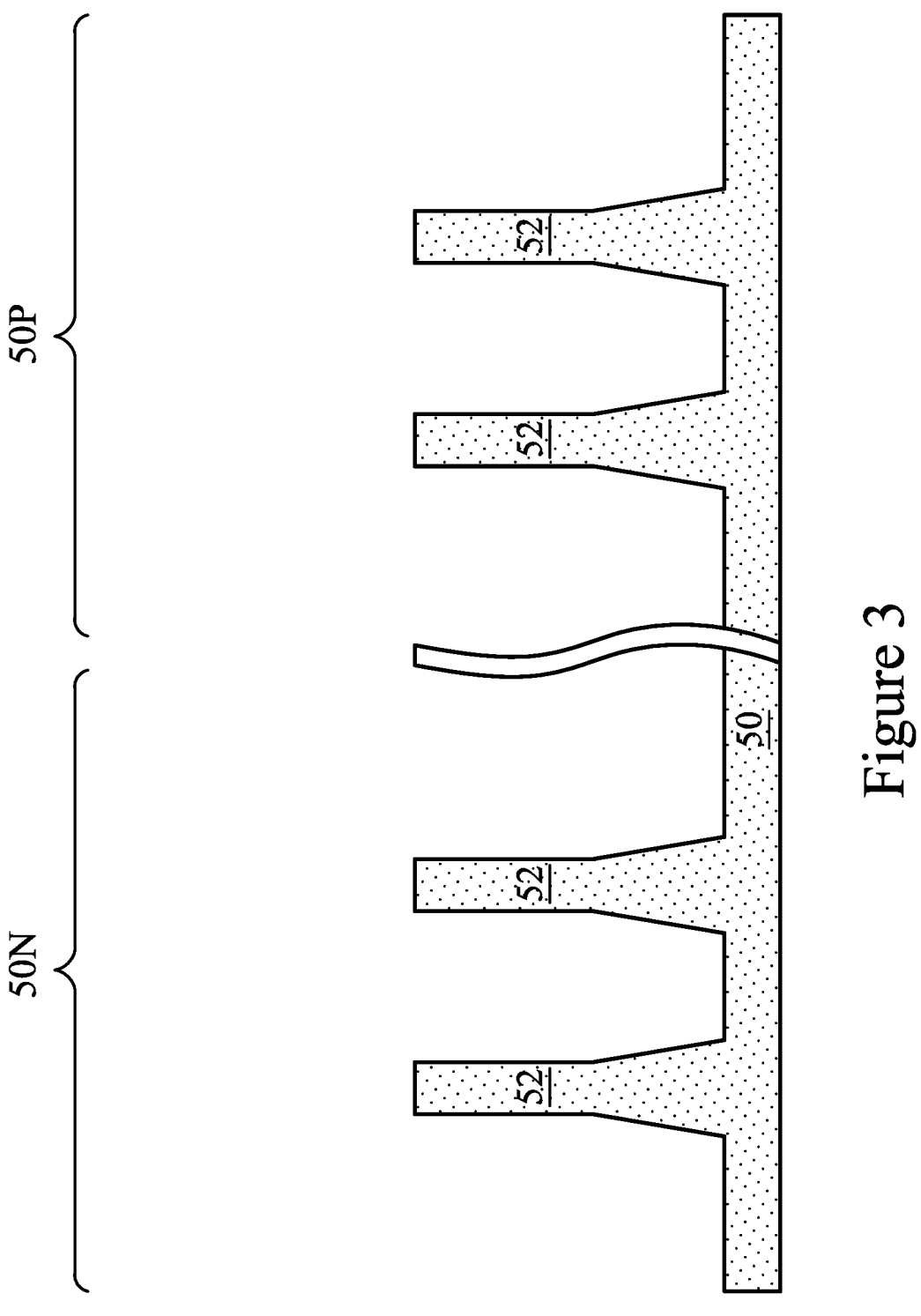

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 4:
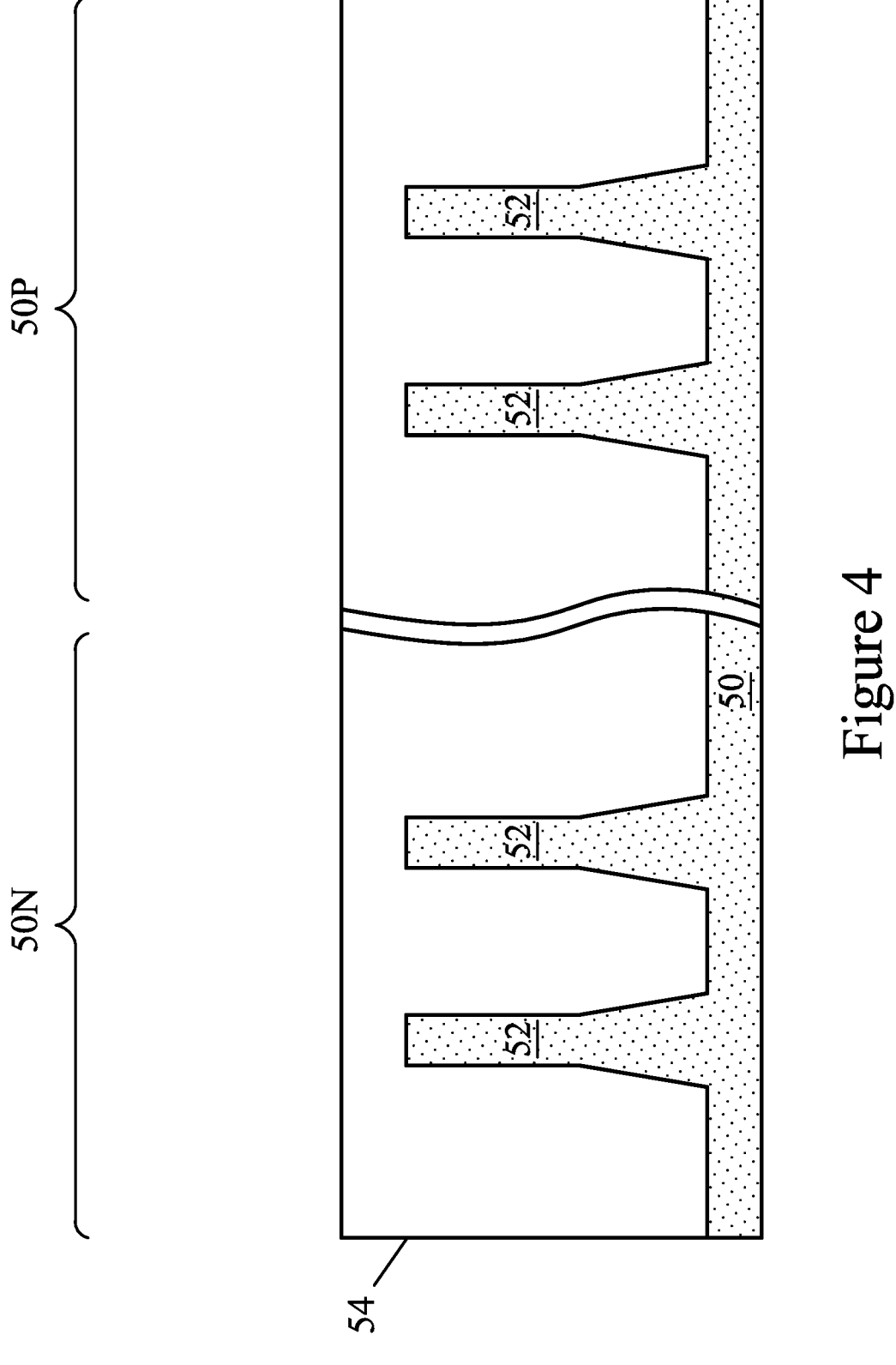

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
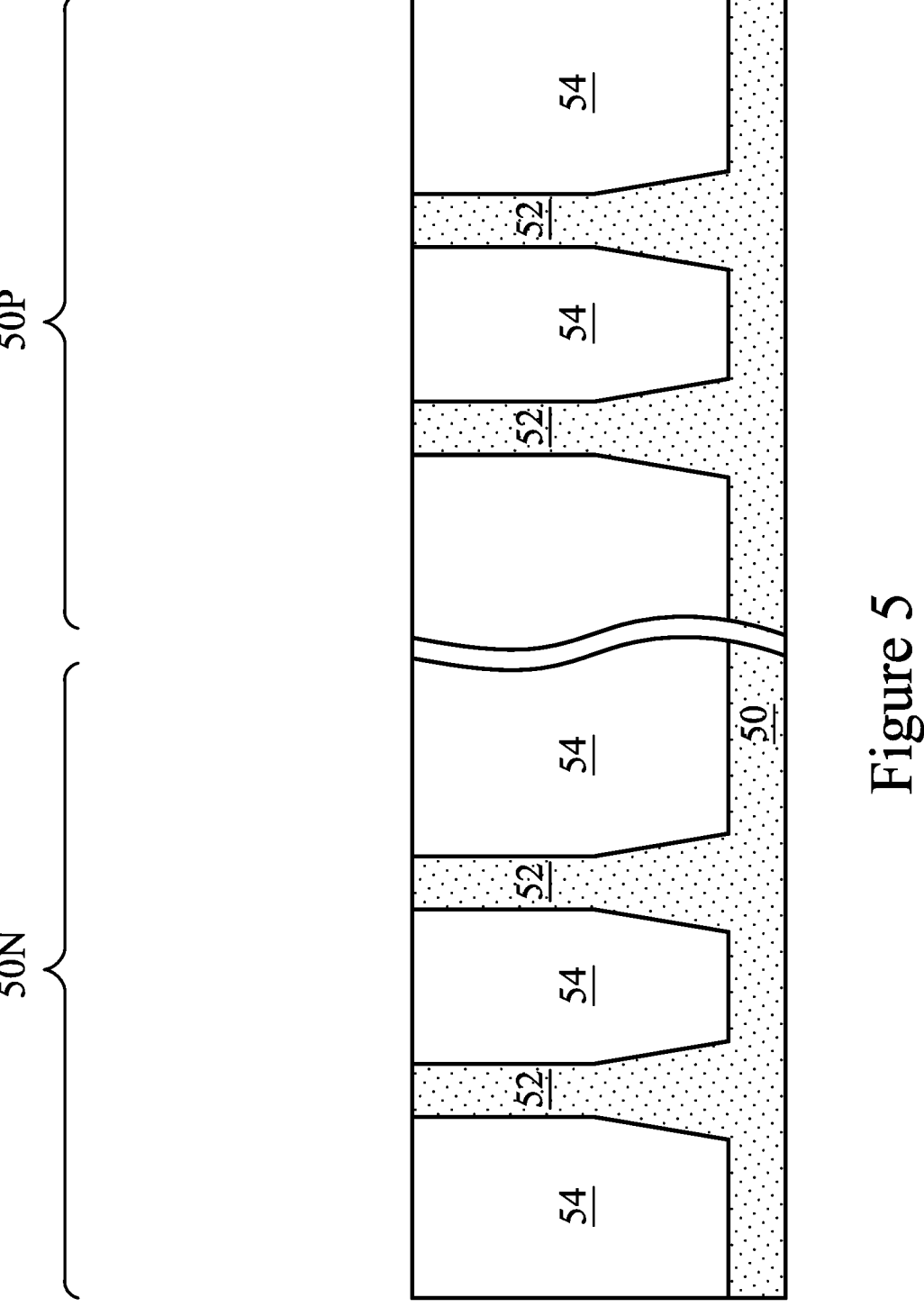

In FIG. 5, a removal process is applied to the insulation material 54 to remove excess insulation material 54 over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material 54 are level after the planarization process is complete.

Figure 6:
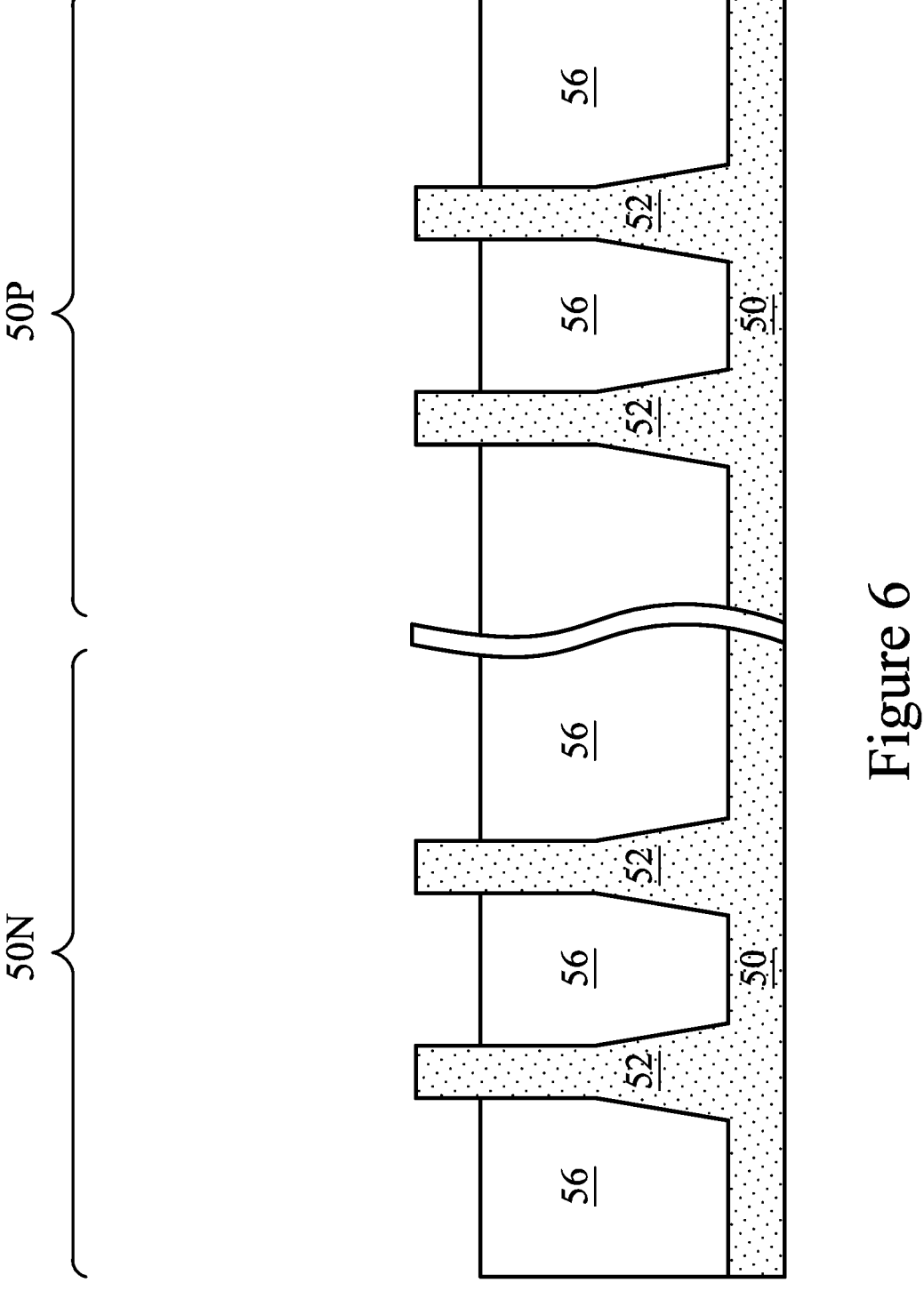

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
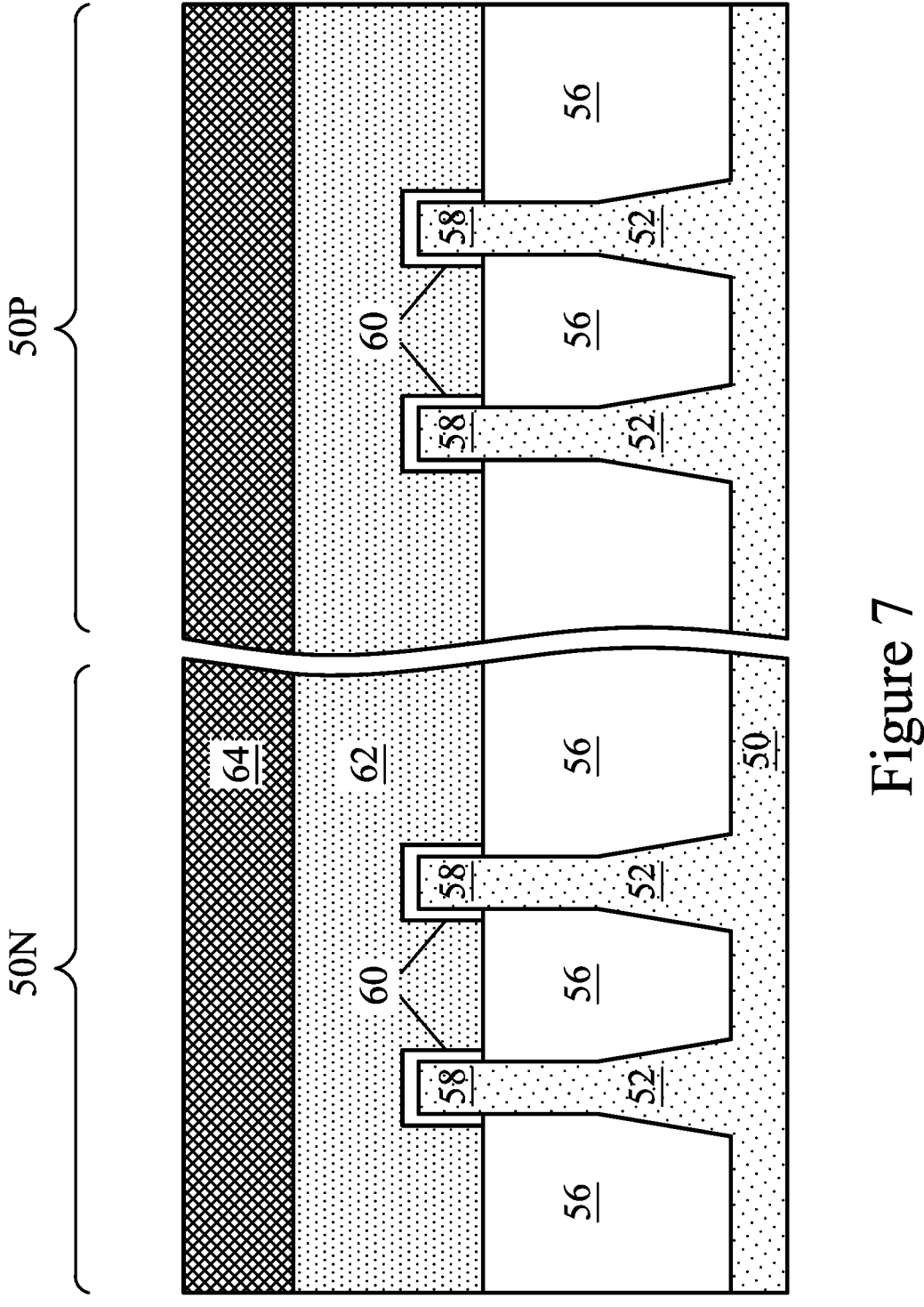

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 20B illustrate various additional steps in the manufacturing of embodiment devices. FIGS. 8A through 20B illustrate features in either of the region 50N and the region 50P. For example, the structures illustrated in FIGS. 8A through 20B may be applicable to both the region 50N and the region 50P. Differences (if any) in the structures of the region 50N and the region 50P are described in the text accompanying each figure.

Figure 8B:
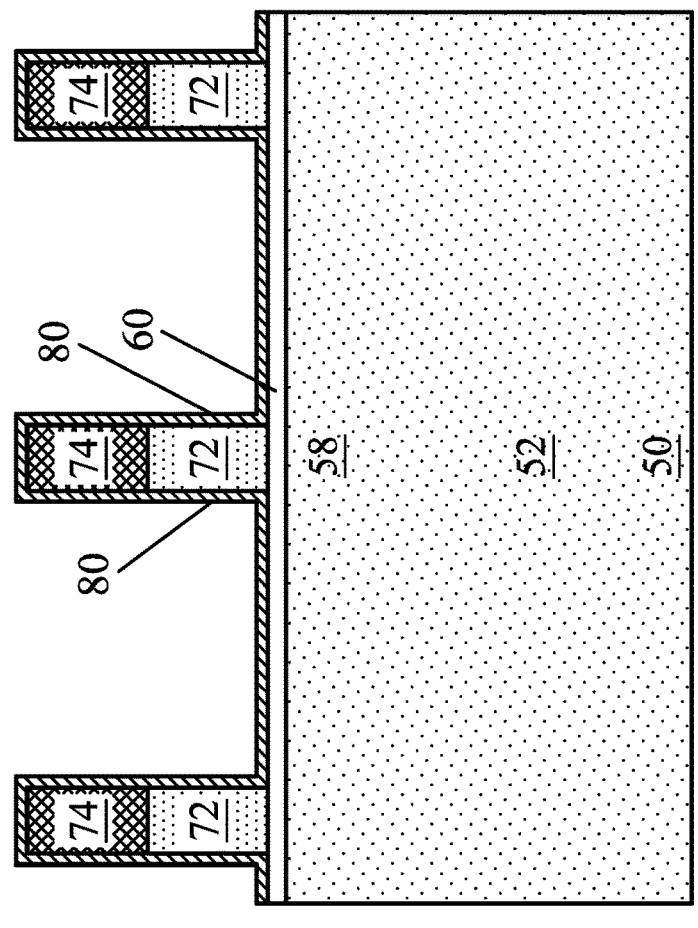
Figure 8A:
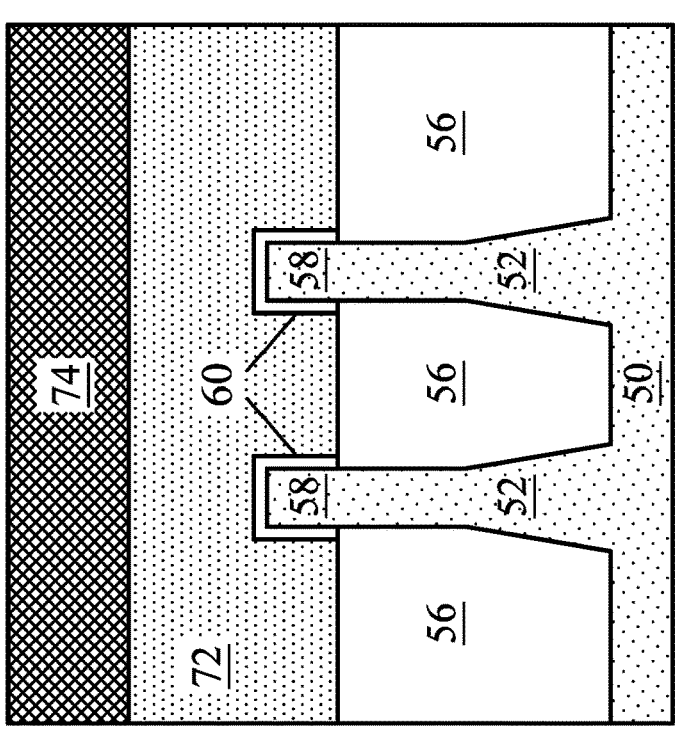

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacer layer 80 can be formed on exposed surfaces of the dummy gates 72, the masks 74, the dummy dielectric layer 60, and/or the fins 52. The gate seal spacer layer 80 may be formed by conformally depositing an insulating material. The insulating material of the gate seal spacer layer 80 may be silicon carbide (SiC), silicon carbonitride (SiCN), the like, or a combination thereof. The gate seal spacer layer 80 may be deposited by atomic layer deposition (ALD), CVD, the like, or a combination thereof. In the ALD example, the process may be begun by introducing a silicon precursor such as dichlorosilane (DCS) ($Si_2H_4Cl_2$), a carbon precursor such as propene ($C_3H_6$), and a nitrogen precursor such as ammonia ($NH_3$) to the dummy gates 72, the masks 74, the dummy dielectric layer 60, and/or the fins 52. In an embodiment the silicon precursor is introduced at a flow rate of from about 800 seem to about 1200 seem, such as about 1000 seem, the carbon precursor is introduced at a flow rate from about 800 seem to about 1200 seem, such as about 1000 seem, and the nitrogen precursor is introduced at a flow rate from about 3500 seem to about 5500 seem, such as about 3500 sccm. Further, the deposition may be performed at a temperature of from about 600° C. to about 700° C., such as about 620° C., and a pressure of between about 66 Pascal and about 931 Pascal, such as about 530 Pascal. The deposition process for the gate seal spacer layer 80 can have a duration from 4 hours to 8 hours, such as about 6 hours. The gate seal spacer layer 80 may be formed to have an atomic concentration of silicon in a range from about 40% to about 60%, such as about 50%; an atomic concentration of carbon in a range from about 5% to about 15%, such as about 10%; and an atomic concentration of nitrogen in a range from about 30% to about 45%, such as about 37%.

Before or after the formation of the gate seal spacer layer 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9B:
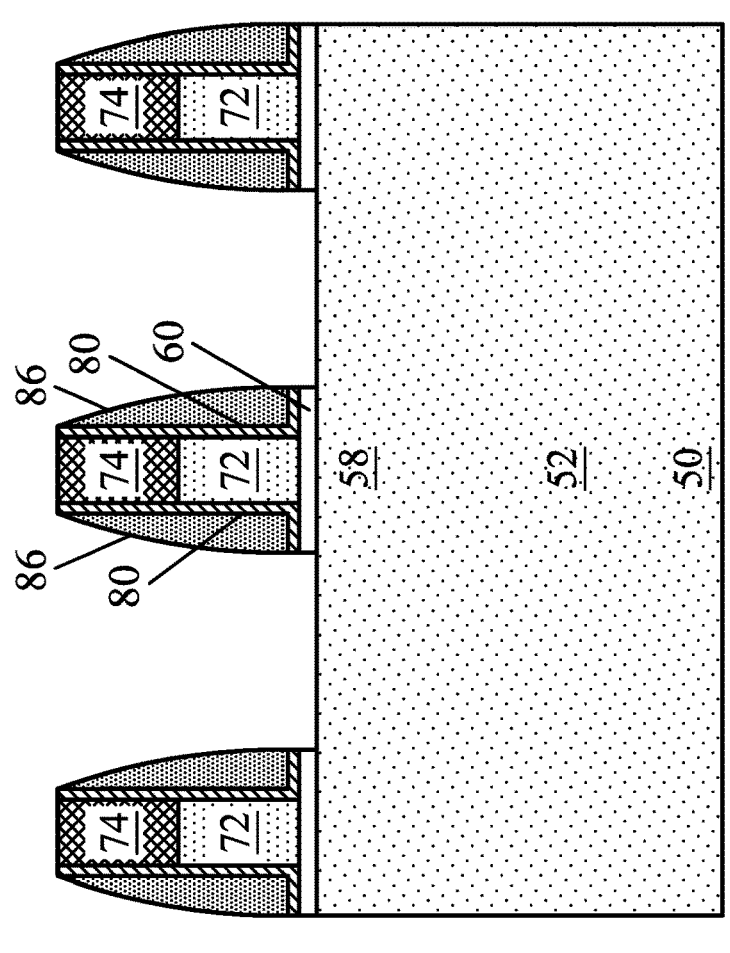
Figure 9A:
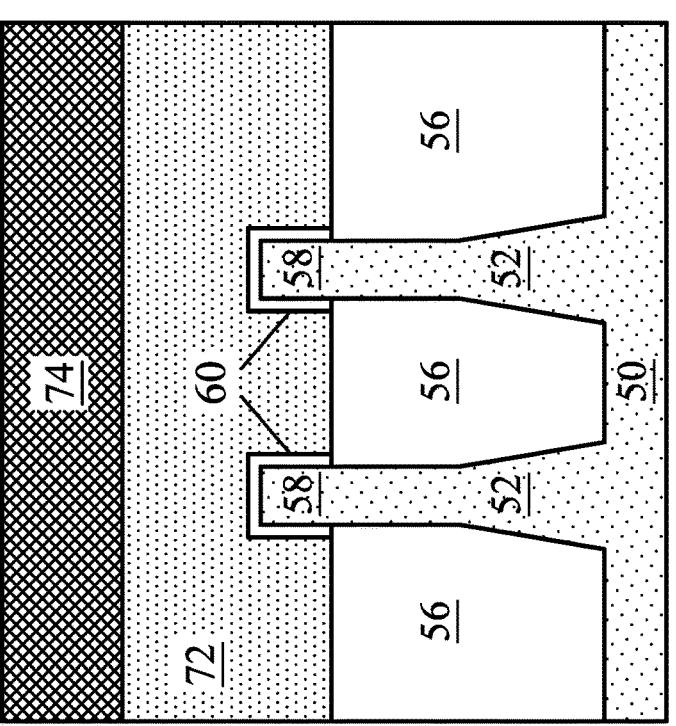

In FIGS. 9A and 9B, gate spacers 86 are formed on the gate seal spacer layer 80 along sidewalls of the dummy gates 72 and the masks 74. The gate spacers 86 may be formed by conformally depositing an insulating material and subsequently anisotropically etching the insulating material of the gate spacers 86 and the gate seal spacer layer 80. The insulating material of the gate spacers 86 may be a low-k layer such as silicon oxycarbonitride (SiOCN) or the like. The insulating material of the gate spacers 86 may be deposited by ALD, CVD, the like, or a combination thereof. In the ALD example, the process may be begun by introducing a silicon precursor such as hexachlorodisilane (HCD) ($Si_2Cl_6$), a carbon precursor such as propene ($C_3H_6$), a nitrogen precursor such as ammonia ($NH_3$), and an oxygen precursor such as $O_2$ to the gate seal spacer layer 80. The insulating material of the gate spacers 86 may be formed to have an atomic concentration of silicon in a range from about 20% to about 40%, such as about 30%; an atomic concentration of oxygen in a range from about 40% to about 70%, such as about 55%; an atomic concentration of carbon in a range from about 0% to about 5%, such as about 2.5%; and an atomic concentration of nitrogen in a range from about 0% to about 15%, such as about 7.5%. In some embodiments, the insulating material of the gate spacers 86 has a k value of about 4. After the insulating material of the gate spacers 86 is formed, an etching process, such as an anisotropic etching process is performed to form the gate seal spacers 80 and the gate spacers 86. The gate spacers 86 may be formed from a low-k material and may be referred to as low-k gate spacers 86.

Figure 10B:
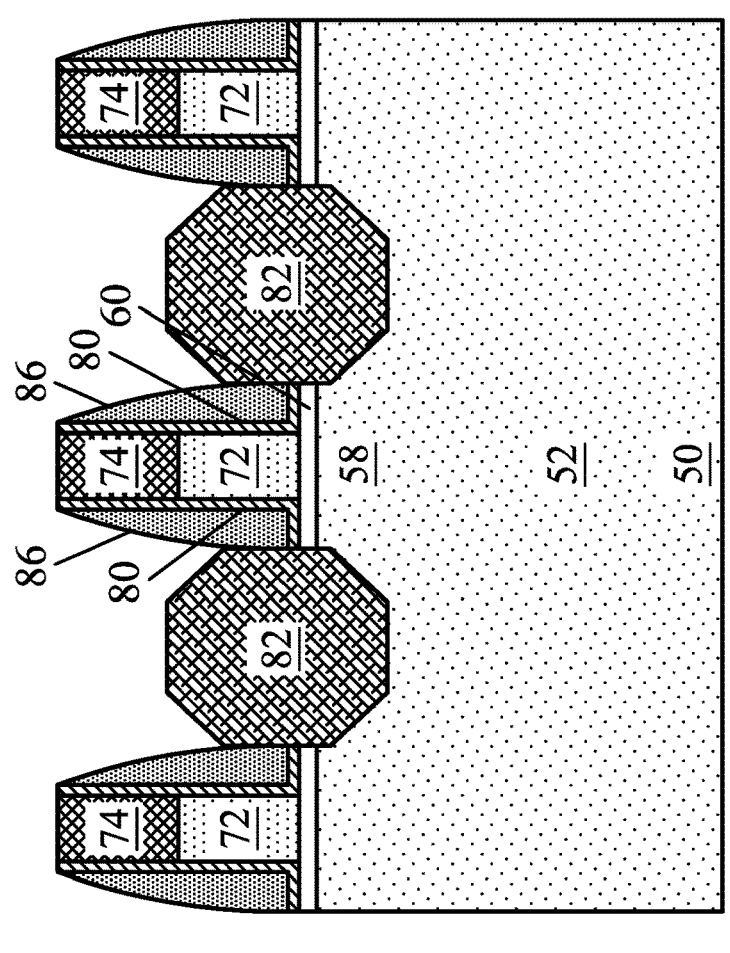
Figure 10A:
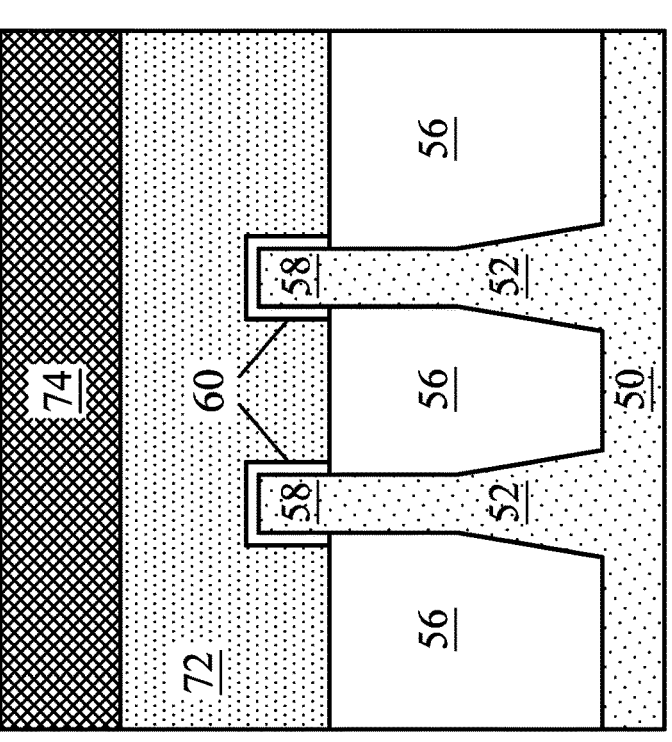
Figure 10D:
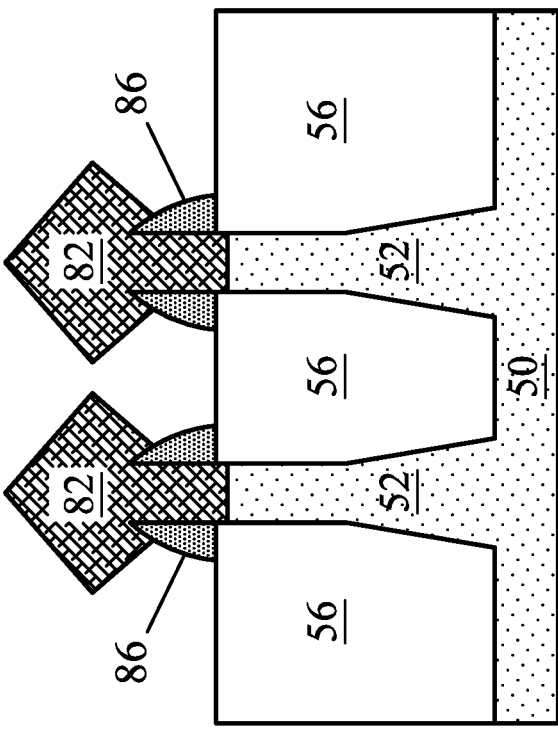
Figure 10C:
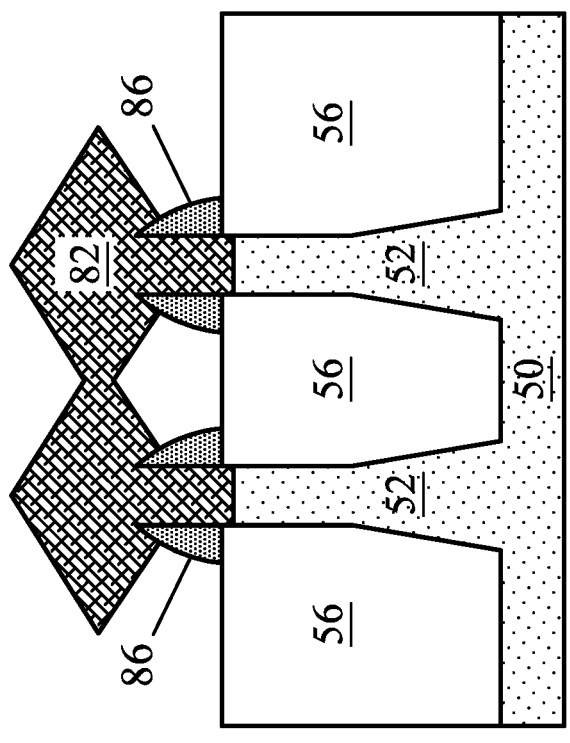

In FIGS. 10A and 10B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as SiGe, SiGeB, Ge, GeSn, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D.

Figure 11B:
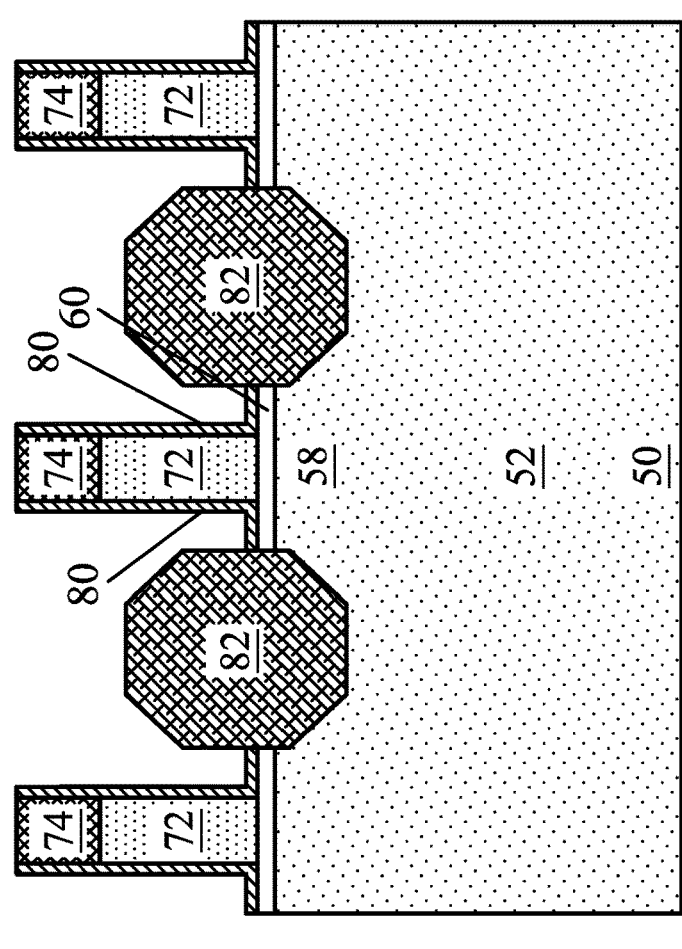
Figure 11A:
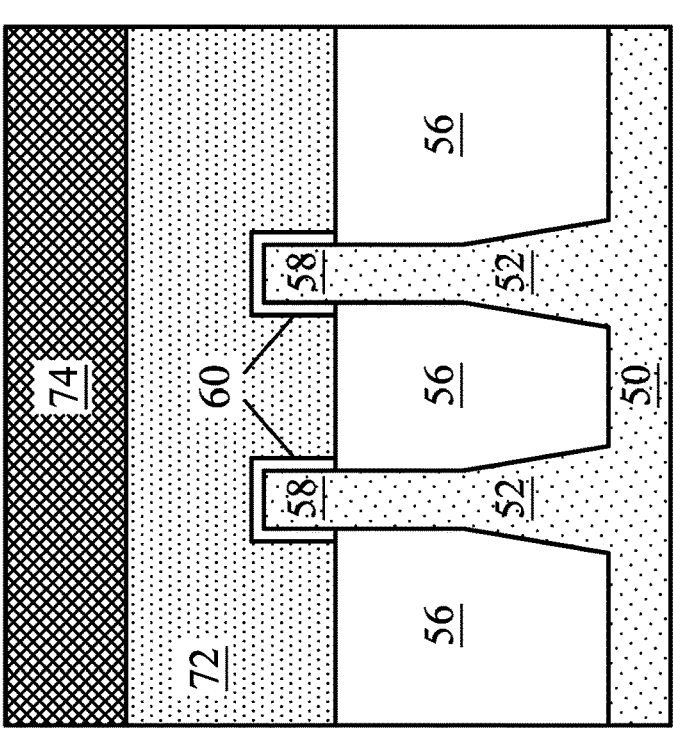

In FIGS. 11A and 11B, the low-k gate spacers 86 are removed to expose the gate seal spacers 80. In some embodiments, the low-k gate spacers 86 are removed by a dry etch process. For example, the etching process may include a dry etch process using reaction gas(es) that selectively etch the low-k gate spacers 86 without etching the gate seal spacers 80 and the source/drain regions 82. In some embodiments, reaction gas(es) in the dry etch process include $NF_3$, HF, and $H_2O$, and the etch process may be performed at a temperature from about 0° C. to about 60° C. During the removal, the gate seal spacers 80 may be used as an etch stop layer when the gate spacers 86 are etched. The removal process forms recesses between the source/drain regions 82 and the gate structures.

Figure 12B:
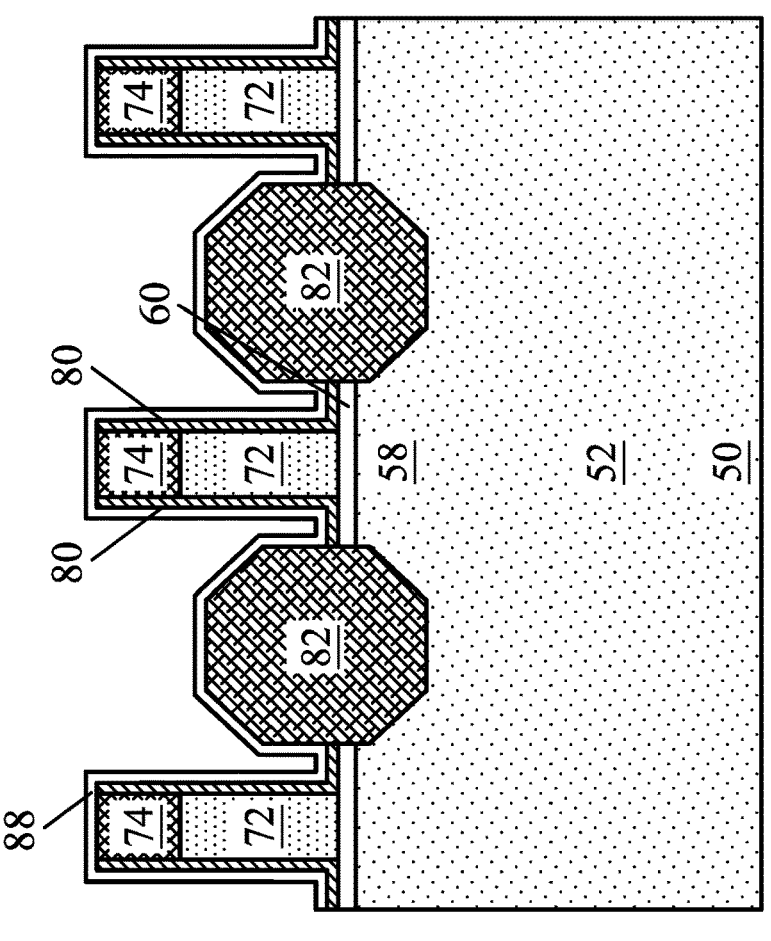
Figure 12A:
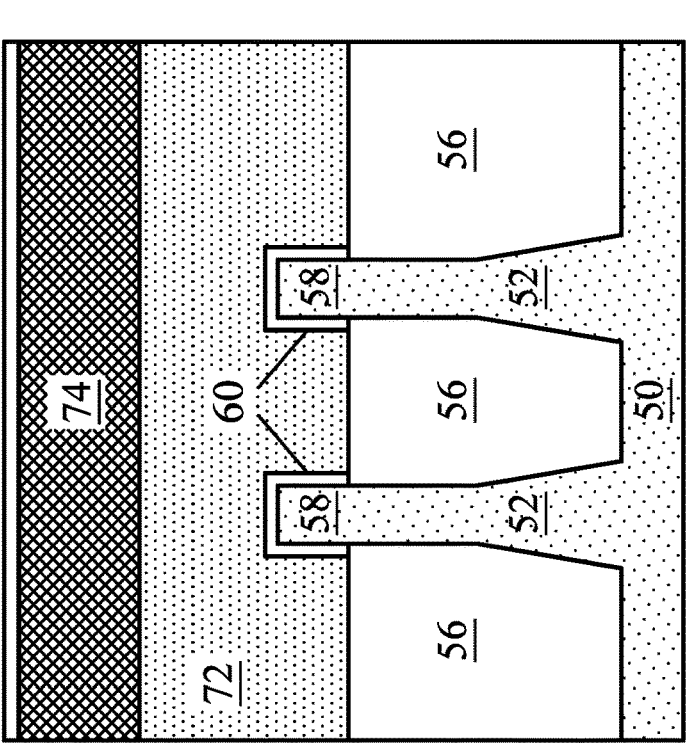

In FIGS. 12A and 12B, a protection layer 88 is formed over the gate structures, the gate seal spacers 80, and the source/drain regions 82. The protection layer 88 may be formed by conformally depositing an insulating material on the structures in FIGS. 11A and 11B. The protection layer 88 is formed without using an oxygen precursor and allows for subsequent formation of low-k spacers that do include oxygen by protecting the source/drain regions 82 from the damage caused by oxidation. The protection layer 88 may be made of SiCN or the like. The protection layer 88 may be deposited by ALD, CVD, the like, or a combination thereof and may be formed to have a thickness from about 10 Angstroms to about 20 Angstroms. In the ALD example, the process may be begun by introducing a silicon precursor such as dichlorosilane (DCS) ($Si_2H_4Cl_2$), a carbon precursor such as propene ($C_3H_6$), and a nitrogen precursor such as ammonia ($NH_3$) to the masks 74, the gate seal spacers 80, and/or the source/drain regions 82. In an embodiment the silicon precursor is introduced at a flow rate of from about 800 seem to about 1200 seem, such as about 1000 seem, the carbon precursor is introduced at a flow rate from about 800 seem to about 1200 sccm, such as about 1000 seem, and the nitrogen precursor is introduced at a flow rate from about 3500 seem to about 5500 seem, such as about 3500 sccm. Further, the deposition may be performed at a temperature of from about 600° C. to about 700° C., such as about 620° C., and a pressure of between about 66 Pascal and about 931 Pascal, such as about 530 Pascal. The deposition process for the protection layer 88 can have a duration from 4 hours to 8 hours, such as about 6 hours. The protection layer 88 may be formed to have an atomic concentration of silicon in a range from about 40% to about 60%, such as about 50%; an atomic concentration of carbon in a range from about 5% to about 15%, such as about 10%; and an atomic concentration of nitrogen in a range from about 30% to about 45%, such as about 37%. In some embodiments, the protection layer 88 has a k value from about 6.0 to about 8.0, such as about 7.0.

Figure 13B:
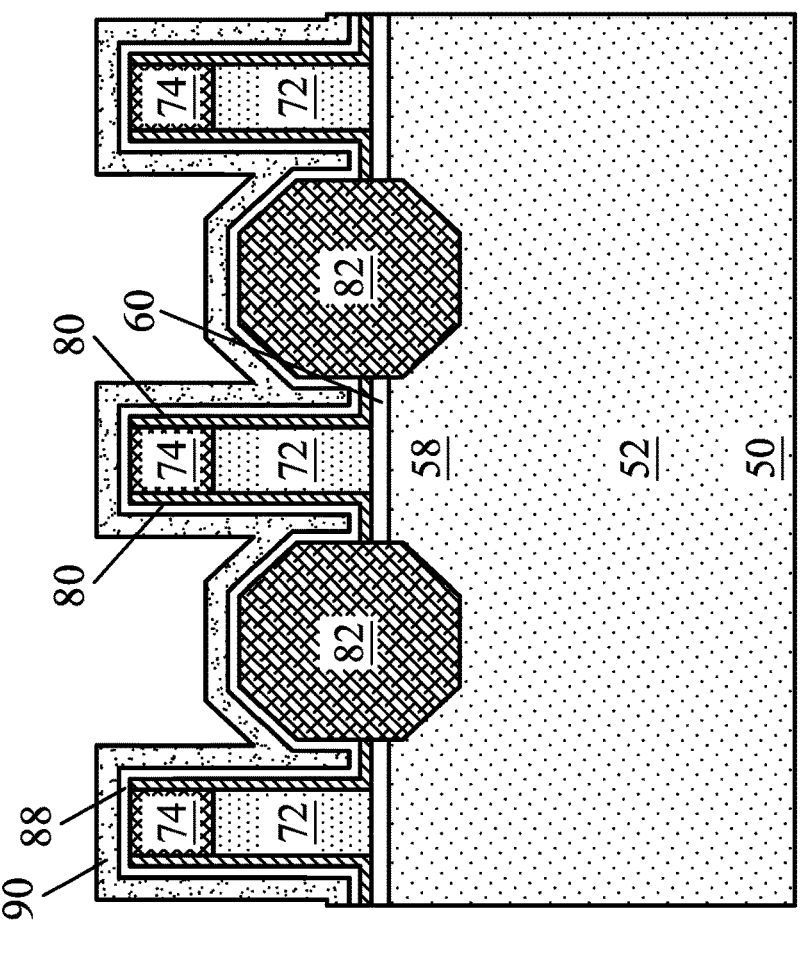
Figure 13A:
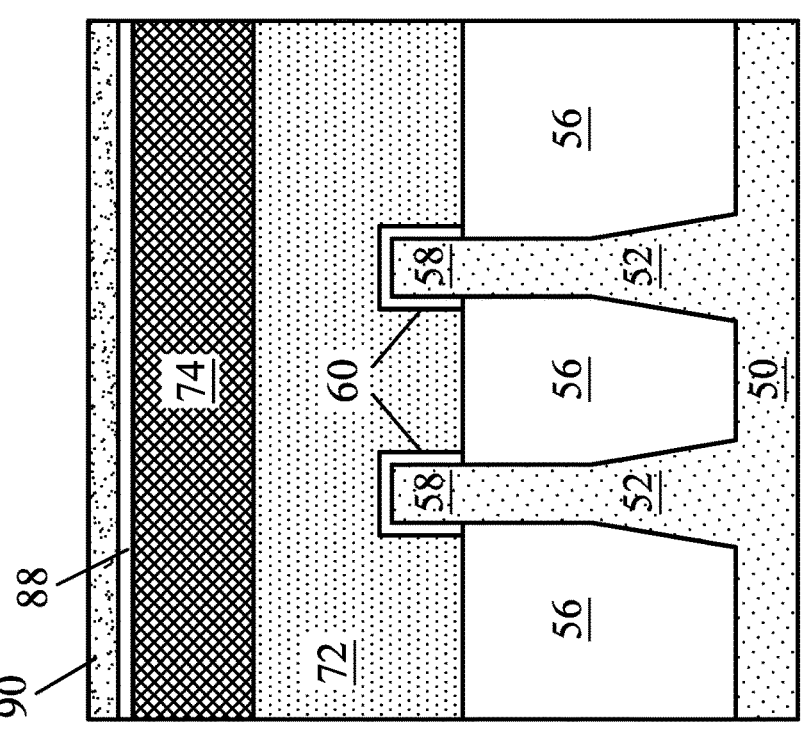

In FIGS. 13A and 13B, a replacement spacer layer 90 is formed over the protection layer 88. The replacement spacer layer 90 may be formed by conformally depositing an insulating material on the protection layer 88. The replacement spacer layer 90 may be a low-k layer such as SiOCN, SiOC, or the like. The replacement spacer layer 90 may be deposited by ALD, CVD, the like, or a combination thereof and may be formed to have a thickness from about 25 Angstroms to about 50 Angstroms. In the ALD example, the process may be begun by introducing a silicon precursor such as hexachlorodisilane (HCD) ($Si_2Cl_6$), dichlorosilane (DCS) ($Si_2H_4Cl_2$), the like, or a combination thereof, a carbon precursor such as propene ($C_3H_6$), a nitrogen precursor such as ammonia ($NH_3$), and an oxygen precursor such as $O_2$ to the gate seal spacer layer 80. The replacement spacer layer 90 may be formed to have an atomic concentration of silicon in a range from about 20% to about 40%, such as about 30%; an atomic concentration of oxygen in a range from about 50% to about 65%, such as about 57%; an atomic concentration of carbon in a range from about 0% to about 5%, such as about 2.5%; and an atomic concentration of nitrogen in a range from about 0% to about 15%, such as about 7.5%. In some embodiments, the replacement spacer layer 90 has a k value of less than or equal to about 3.5.

Figure 14B:
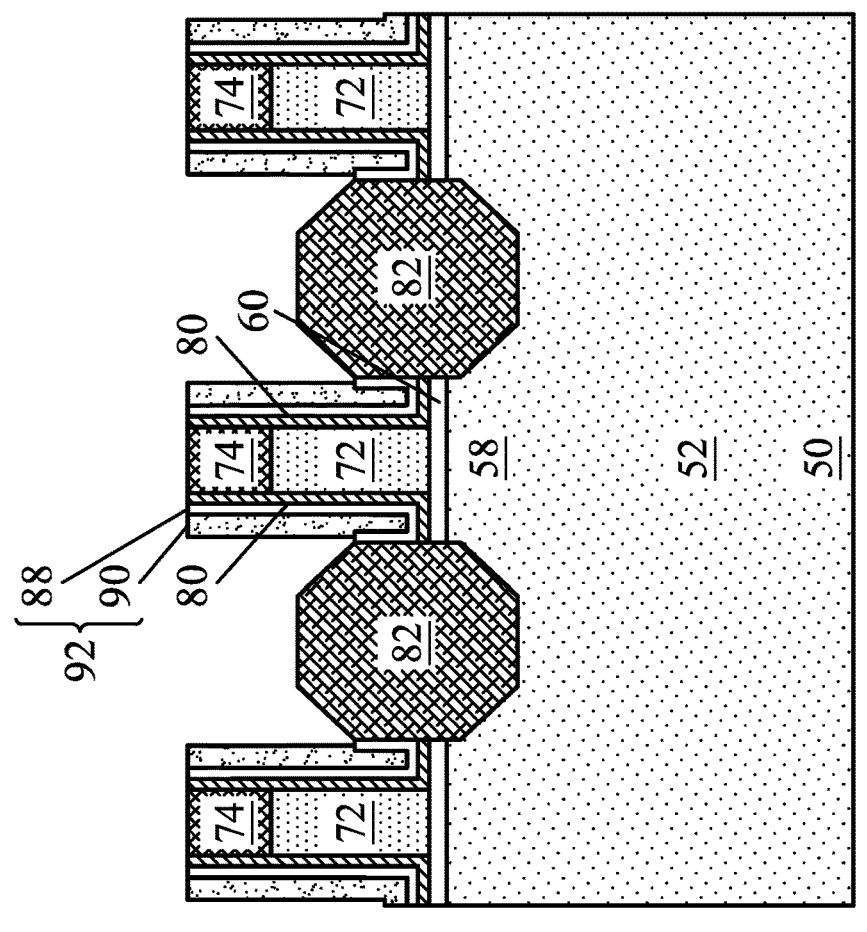
Figure 14A:
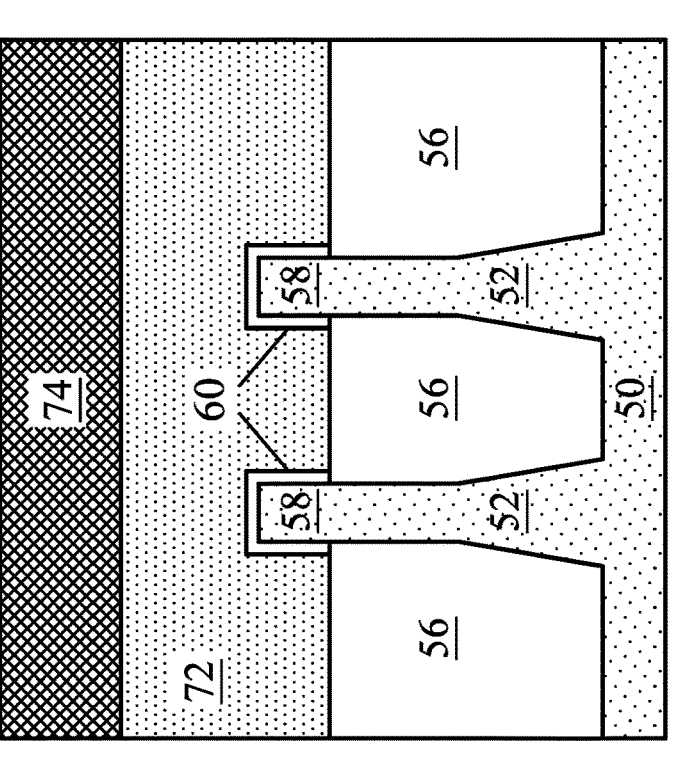

In FIGS. 14A and 14B, the replacement spacer layer 90 and the protection layer 88 are removed from top surfaces of the masks 74 and the source/drain regions 82 to form replacement gate spacers 92. The replacement spacer layer 90 and the protection layer 88 may be removed by an etching process, such as an anisotropic etching process to form the replacement gate spacers 92. The replacement gate spacers 92 may be formed from a low-k material and may be referred to as low-k gate spacers 92.

By having the replacement gate spacer layer 90 (and, therefore, the replacement gate spacers 92) formed of low-k material, performance of the FinFET devices can be improved due to the reduction in the capacitance between the gate and the source/drain regions of the devices. In addition, the protection layer 88 enables the reduced capacitance without causing damage to the source/drain regions 82, which would degrade performance of the devices. In particular, the source/drain regions 82 are epitaxial structures and the spacers 92 formed on sidewalls of the gate electrodes are formed as low-k spacers to reduce the capacitance between the gate electrodes and the source/drain regions 82. The protection layer protects the source/drain regions and prevent them from being damaged during the formation of the low-k spacers 92.

Figures 15A, 15B:
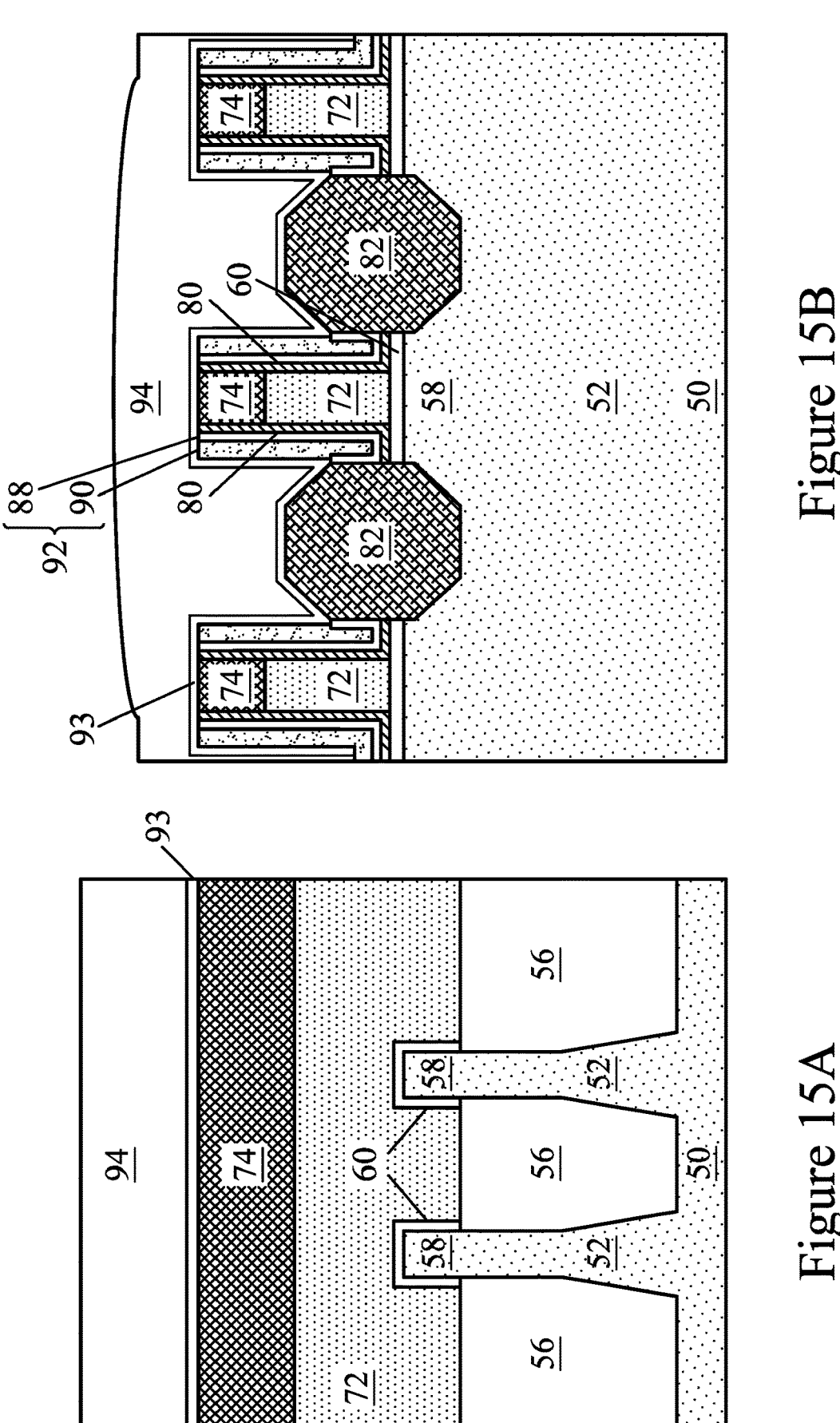

In FIGS. 15A and 15B, a first ILD 94 is deposited over the structure illustrated in FIGS. 14A and 14B. The first ILD 94 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 93 is disposed between the first ILD 94 and the epitaxial source/drain regions 82, the mask 74, the gate seal spacers 80, and the replacement gate spacers 92. The CESL 93 may comprise a dielectric material, such as, silicon nitride, silicon oxide, silicon oxynitride, or the like, having a different etch rate than the material of the overlying first ILD 94.

Figure 16B:
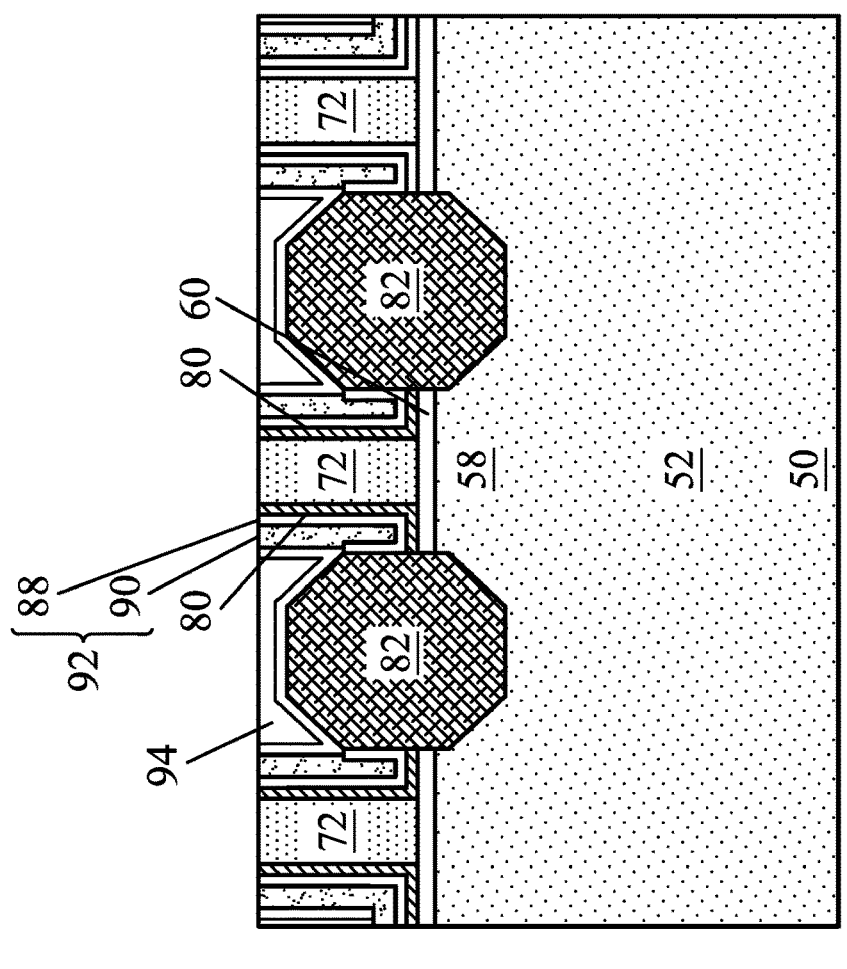
Figure 16A:
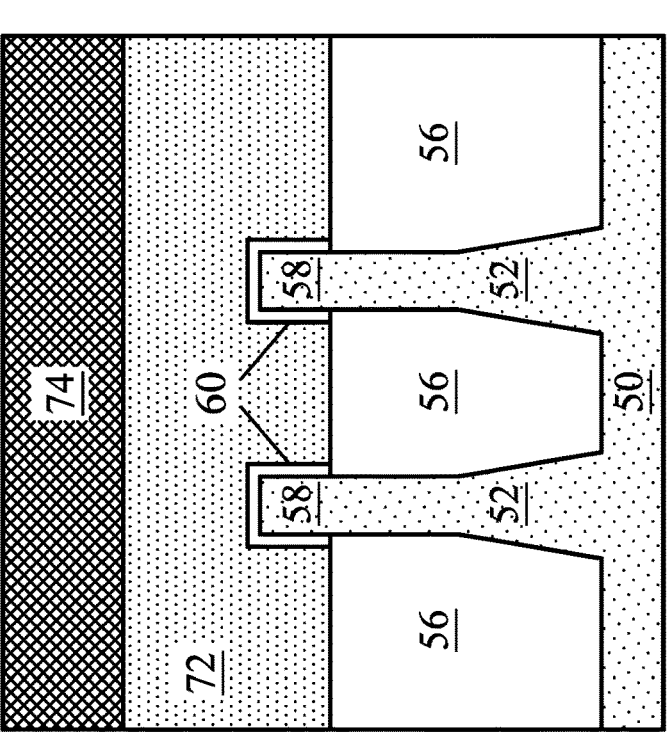

In FIGS. 16A and 16B, a planarization process, such as a CMP, may be performed to level the top surface of the first ILD 94 with the top surfaces of the dummy gates 72 or the masks 74. The planarization process may also remove the masks 74 on the dummy gates 72, and portions of the gate seal spacers 80 and the replacement spacers 92 along sidewalls of the masks 74. After the planarization process, top surfaces of the dummy gates 72, the gate seal spacers 80, the replacement gate spacers 92, and the first ILD 94 are level. Accordingly, the top surfaces of the dummy gates 72 are exposed through the first ILD 94. In some embodiments, the masks 74 may remain, in which case the planarization process levels the top surface of the first ILD 94 with the top surfaces of masks 74.

Figure 17B:
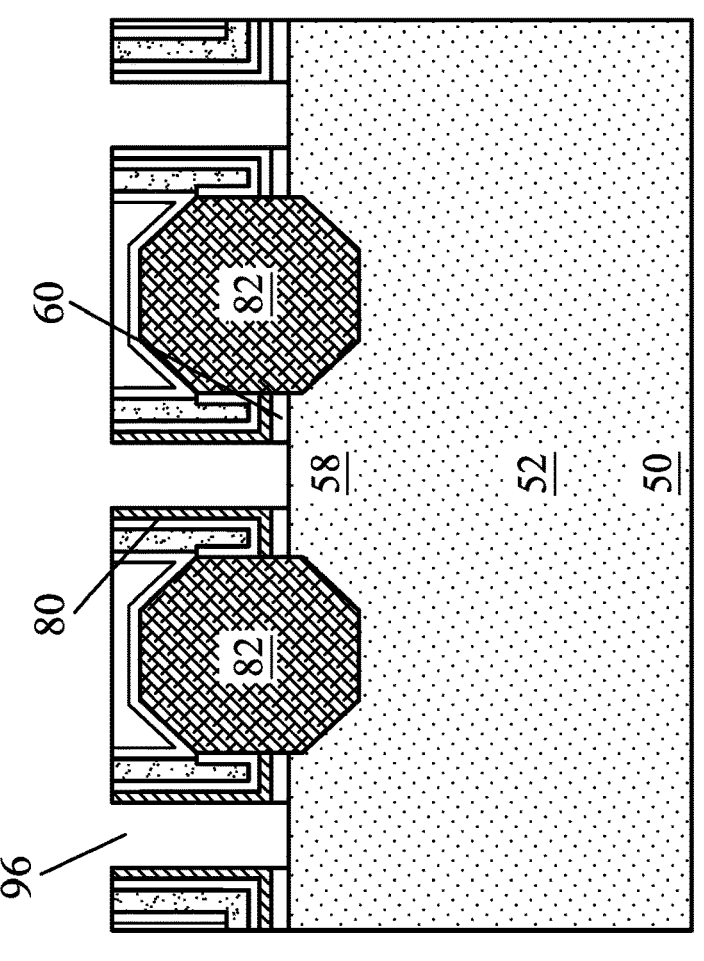
Figure 17A:
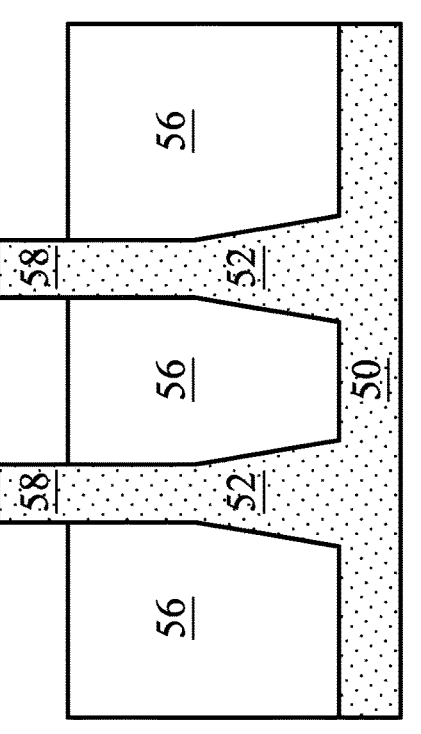

In FIGS. 17A and 17B, the dummy gates 72, and the masks 74 if present, are removed in an etching step(s), so that recesses 96 are formed. Portions of the dummy dielectric layer 60 in the recesses 96 may also be removed. In some embodiments, only the dummy gates 72 are removed and the dummy dielectric layer 60 remains and is exposed by the recesses 96. In some embodiments, the dummy dielectric layer 60 is removed from recesses 96 in a first region of a die (e.g., a core logic region) and remains in recesses 96 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 94, the gate seal spacers 80, or the replacement gate spacers 92. Each recess 96 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figures 18A, 18B:
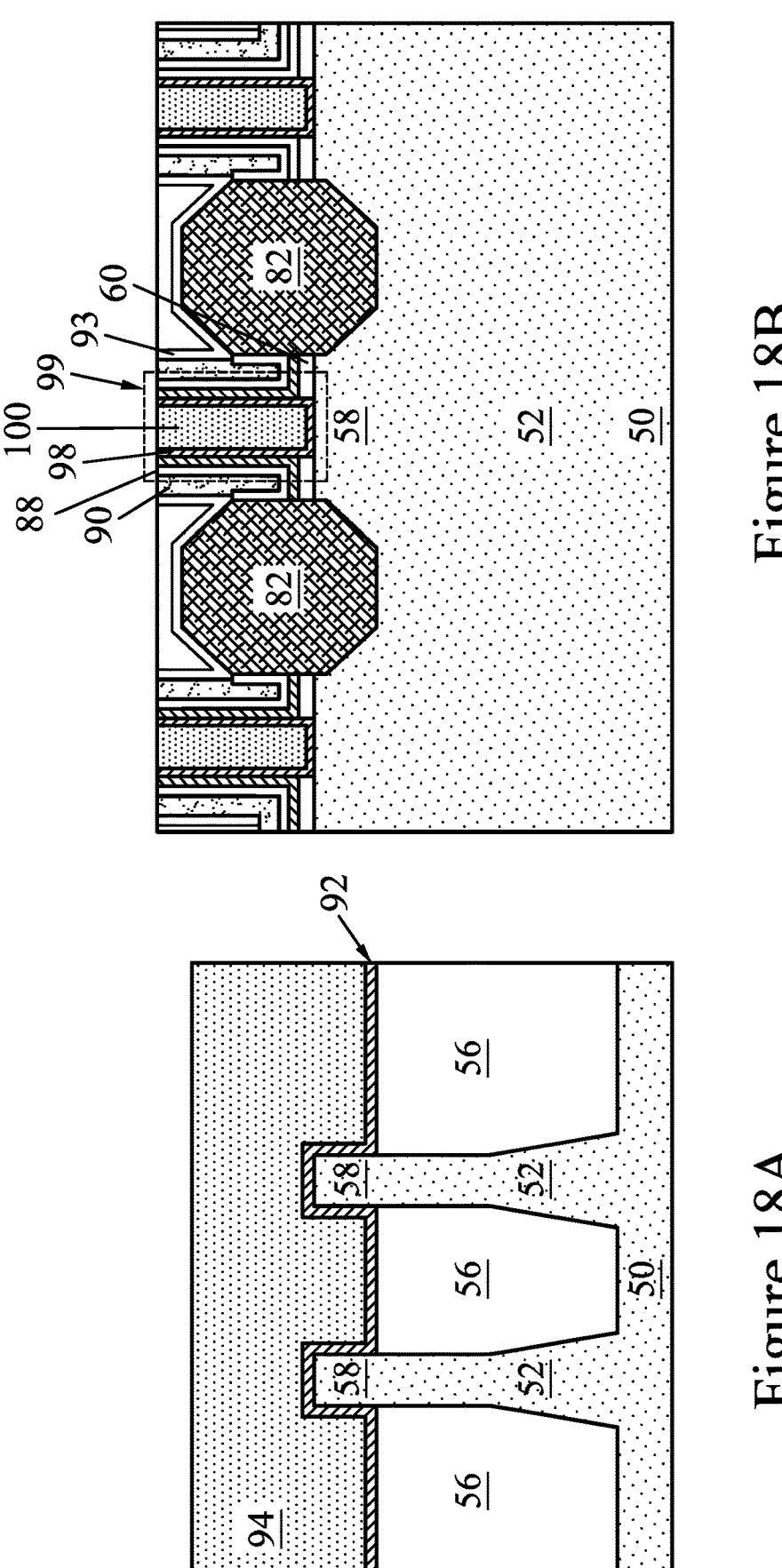
Figure 18C:
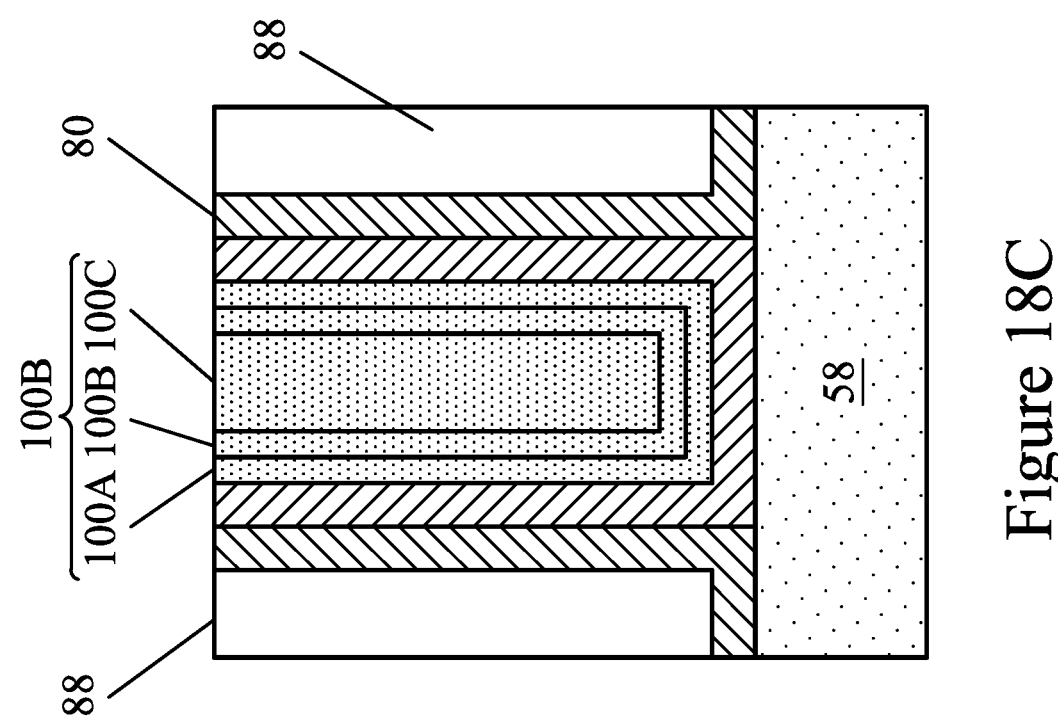

In FIGS. 18A and 18B, gate dielectric layers 98 and gate electrodes 100 are formed for replacement gates. FIG. 18C illustrates a detailed view of region 99 of FIG. 18B. Gate dielectric layers 98 are deposited conformally in the recesses 96, such as on the top surfaces and the sidewalls of the fins 52 and on sidewalls of the gate seal spacers 80/replacement gate spacers 92. The gate dielectric layers 98 may also be formed on top surface of the first ILD 94. In accordance with some embodiments, the gate dielectric layers 98 comprise silicon oxide, silicon nitride, or multilayers thereof. In some embodiments, the gate dielectric layers 98 include a high-k dielectric material, and in these embodiments, the gate dielectric layers 98 may have a k value greater than about 7.0, and may include a metal oxide or a silicate of Hf, Al, Zr, La, Mg, Ba, Ti, Pb, and combinations thereof. The formation methods of the gate dielectric layers 98 may include Molecular-Beam Deposition (MBD), ALD, PECVD, and the like. In embodiments where portions of the dummy dielectric layer 60 remains in the recesses 96, the gate dielectric layers 98 include a material of the dummy gate dielectric 60 (e.g., $SiO_2$).

The gate electrodes 100 are deposited over the gate dielectric layers 98, respectively, and fill the remaining portions of the recesses 96. The gate electrodes 100 may include a metal-containing material such as TiN, TiO, TaN, TaC, Co, Ru, Al, W, combinations thereof, or multi-layers thereof. For example, although a single layer gate electrode 100 is illustrated in FIG. 18B, the gate electrode 100 may comprise any number of liner layers 100A, any number of work function tuning layers 100B, and a fill material 100C as illustrated by FIG. 18C. After the filling of the gate electrodes 100, a planarization process, such as a CMP, may be performed to remove the excess portions of the gate dielectric layers 98 and the material of the gate electrodes 100, which excess portions are over the top surface of the first ILD 94. The remaining portions of material of the gate electrodes 100 and the gate dielectric layers 98 thus form replacement gates of the resulting FinFETs. The gate electrodes 100 and the gate dielectric layers 98 may be collectively referred to as a "gate stack." The gate and the gate stacks may extend along sidewalls of a channel region 58 of the fins 52.

The formation of the gate dielectric layers 98 in the region 50N and the region 50P may occur simultaneously such that the gate dielectric layers 98 in each region are formed from the same materials, and the formation of the gate electrodes 100 may occur simultaneously such that the gate electrodes 100 in each region are formed from the same materials. In some embodiments, the gate dielectric layers 98 in each region may be formed by distinct processes, such that the gate dielectric layers 98 may be different materials, and/or the gate electrodes 100 in each region may be formed by distinct processes, such that the gate electrodes 100 may be different materials. Various masking steps may be used to mask and expose appropriate regions when using distinct processes.

Figures 19A, 19B:
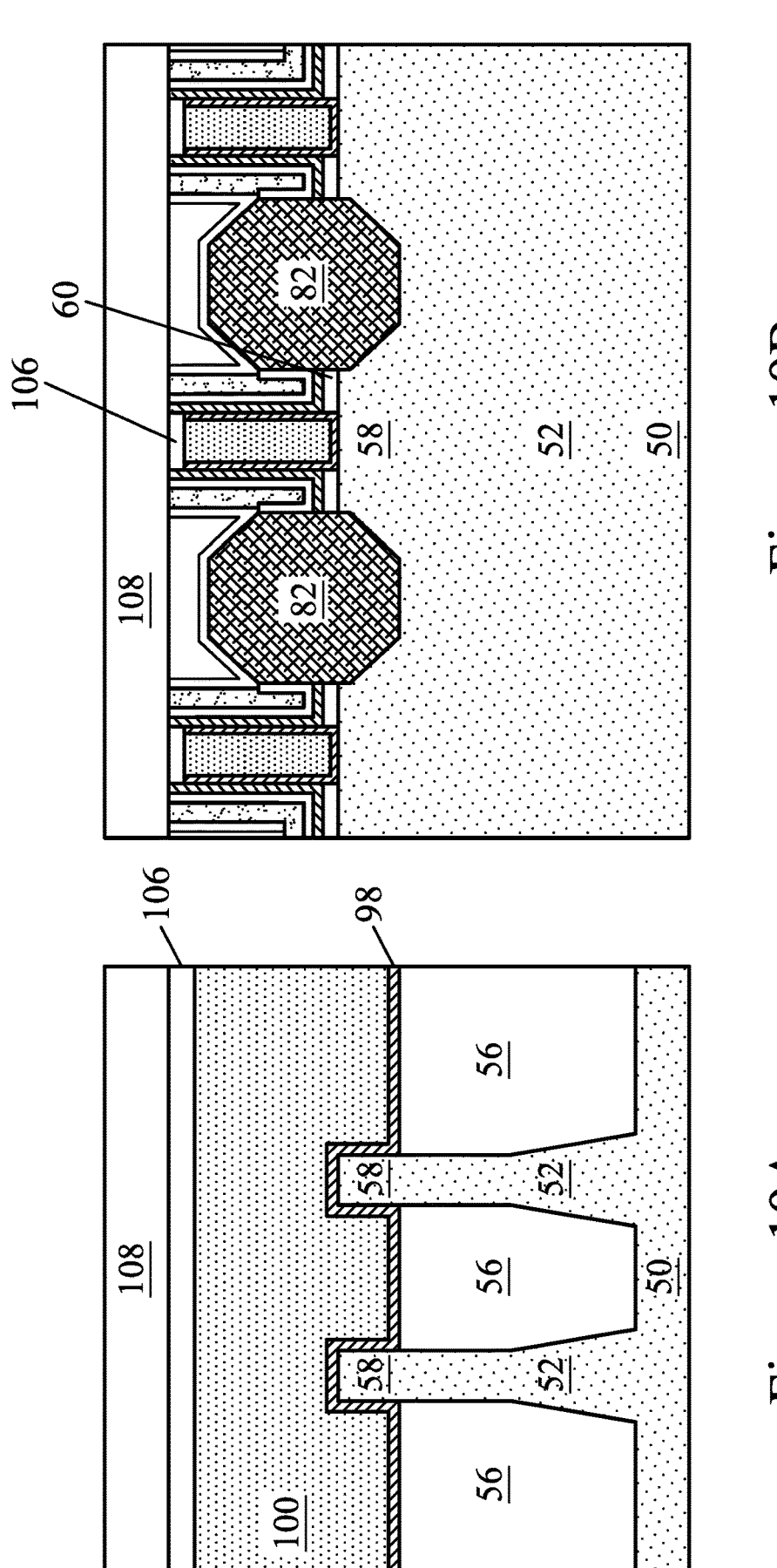

In FIGS. 19A and 19B, a second ILD 108 is deposited over the first ILD 94. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 98 and a corresponding overlying gate electrode 100) is recessed, so that a recess is formed directly over the gate stack and between opposing portions of gate seal spacers 80 and replacement gate spacers 92, as illustrated in FIGS. 19A and 19B. A gate mask 106 comprising one or more layers of dielectric material, such as silicon nitride, silicon oxynitride, or the like, is filled in the recess, followed by a planarization process to remove excess portions of the dielectric material extending over the first ILD 94. The subsequently formed gate contacts 110 (FIGS. 20A and 20B) penetrate through the gate mask 106 to contact the top surface of the recessed gate electrode 100.

Figures 20A, 20B:
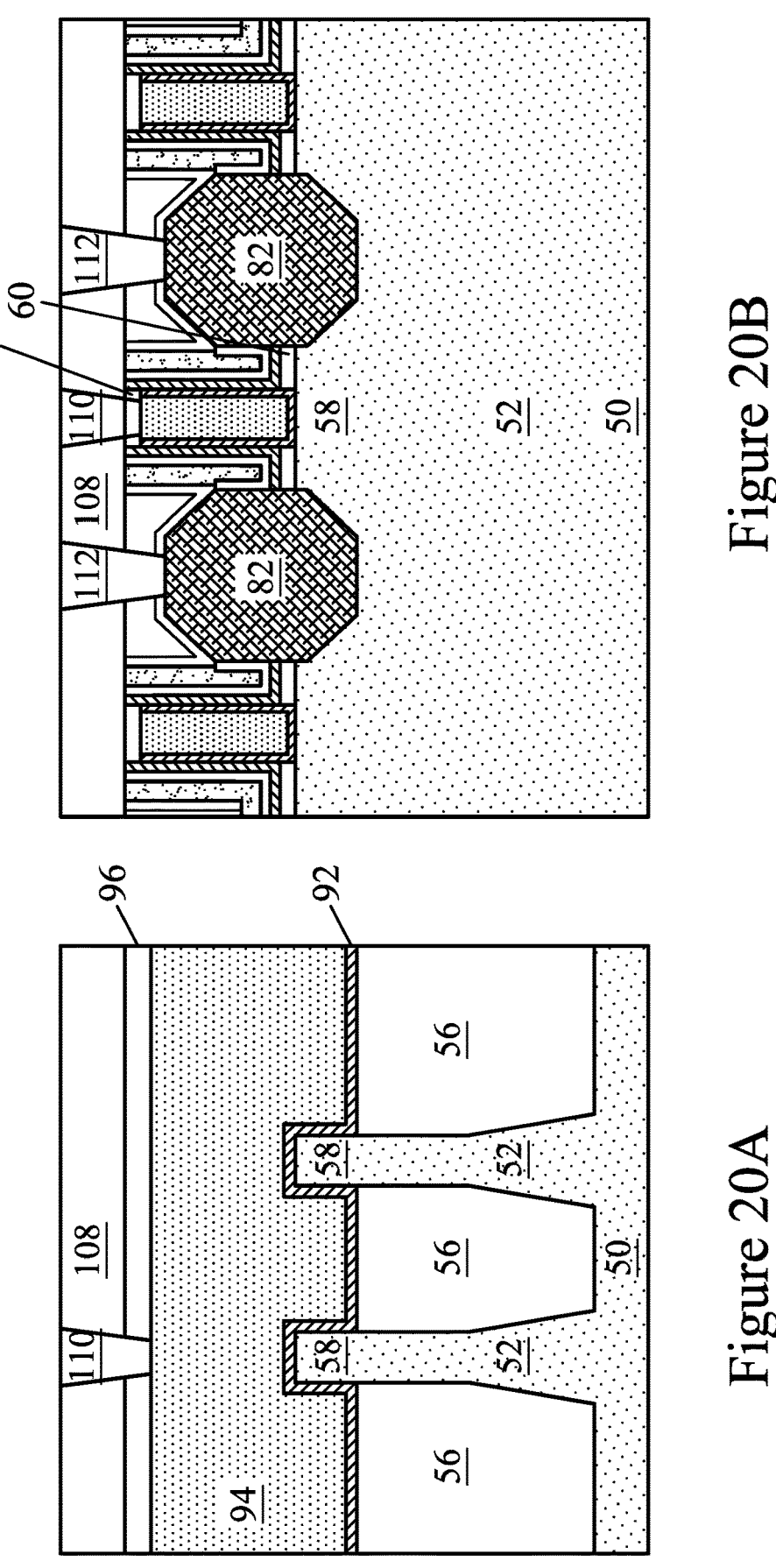

In FIGS. 20A and 20B, gate contacts 110 and source/drain contacts 112 are formed through the second ILD 108 and the first ILD 94 in accordance with some embodiments. Openings for the source/drain contacts 112 are formed through the first and second ILDs 94 and 108, and openings for the gate contact 110 are formed through the second ILD 108 and the gate mask 106. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

FIGS. 21A through 25B illustrate embodiment of forming replacement gate_spacers 92. This embodiment is similar to the previous embodiment of FIGS. 2 through 20B except that in this embodiment, the gate spacers 86 are recessed instead of removed. Details regarding this embodiment that are similar to those for the previously described embodiment will not be repeated herein.

Figure 21B:
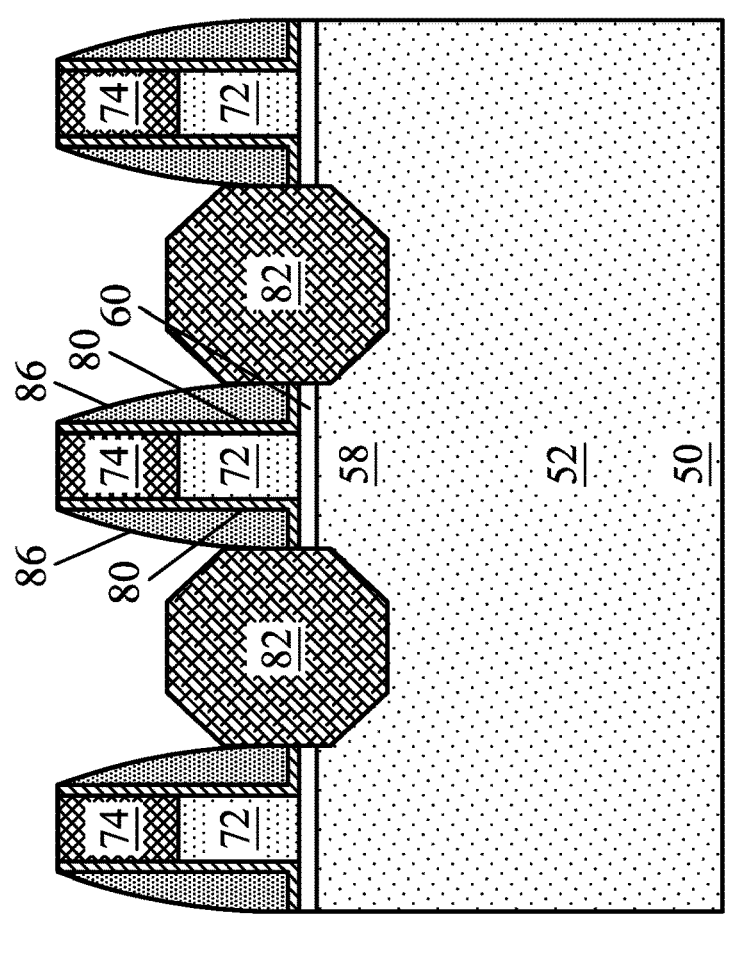
FIGS. 21A, 21B, 22A, 22B, 23A, 23B, 24A, 24B, 25A, and 25B are cross-sectional views of intermediate stages in the manufacturing of FinFETs, in accordance with some embodiments.
Figure 21A:
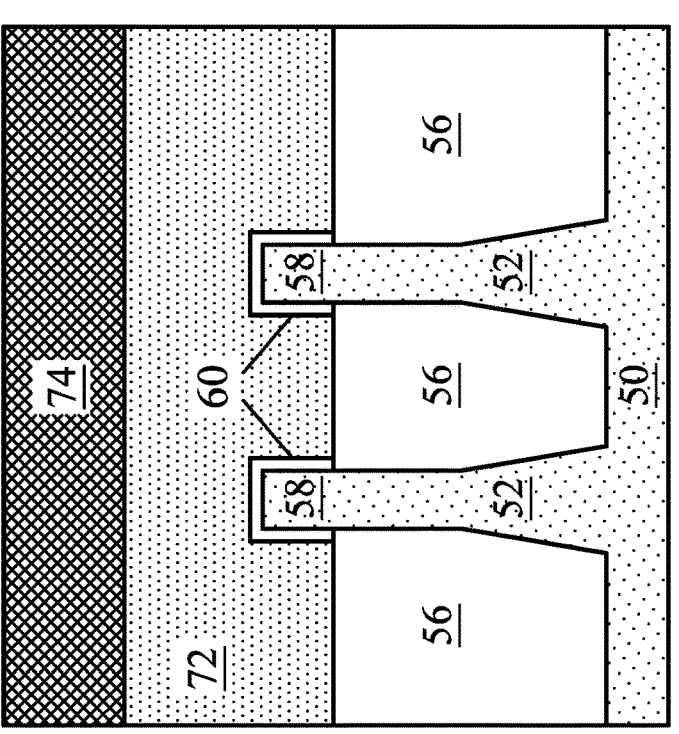

FIGS. 21A and 21B are an equivalent intermediate stage of processing as FIGS. 10A and 10B and the descriptions are not repeated herein.

Figure 22B:
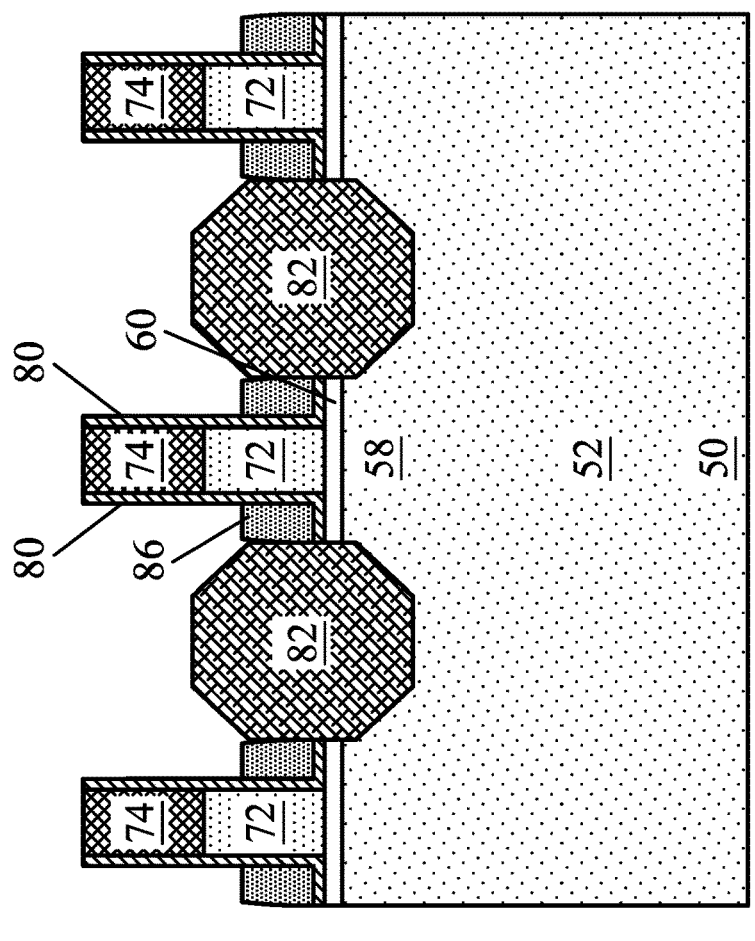
Figure 22A:
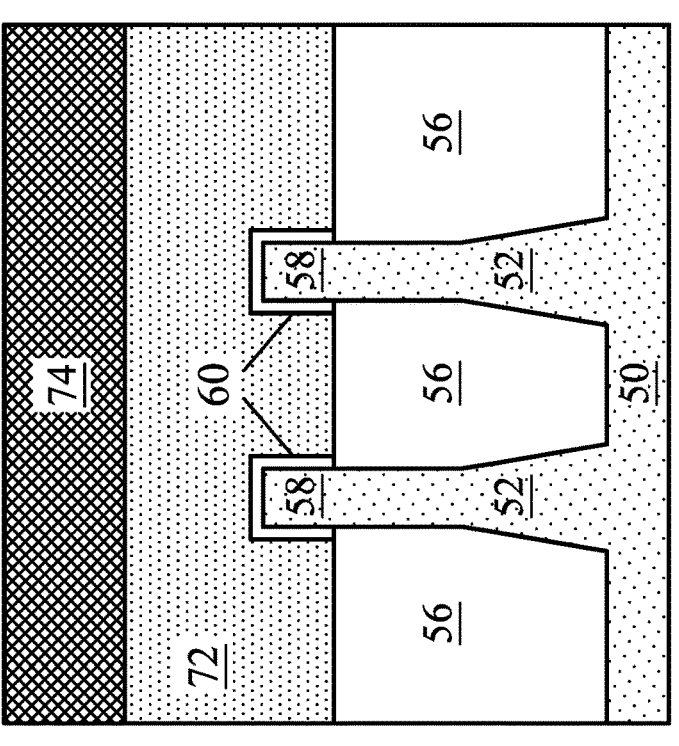

In FIGS. 22A and 22B, the gate spacers 86 are recessed to expose portions of the gate seal spacers 80 along sidewalls of the dummy gates 72 and the masks 74. The recessed gate spacers 86 may be referred to as spacer footings 86. In some embodiments, the gate spacers 86 are recessed by a dry etch process. For example, the etching process may include a dry etch process using reaction gas(es) that selectively etch the low-k gate spacers 86 without etching the gate seal spacers 80 and the source/drain regions 82. In some embodiments, reaction gas(es) in the dry etch process include NF₃, HF, and H₂O, and the etch process may be performed at a temperature from about 0° C. to about 60° C. During the recessing, the gate seal spacers 80 may be used as an etch stop layer when the gate spacers 86 are etched.

Figure 23B:
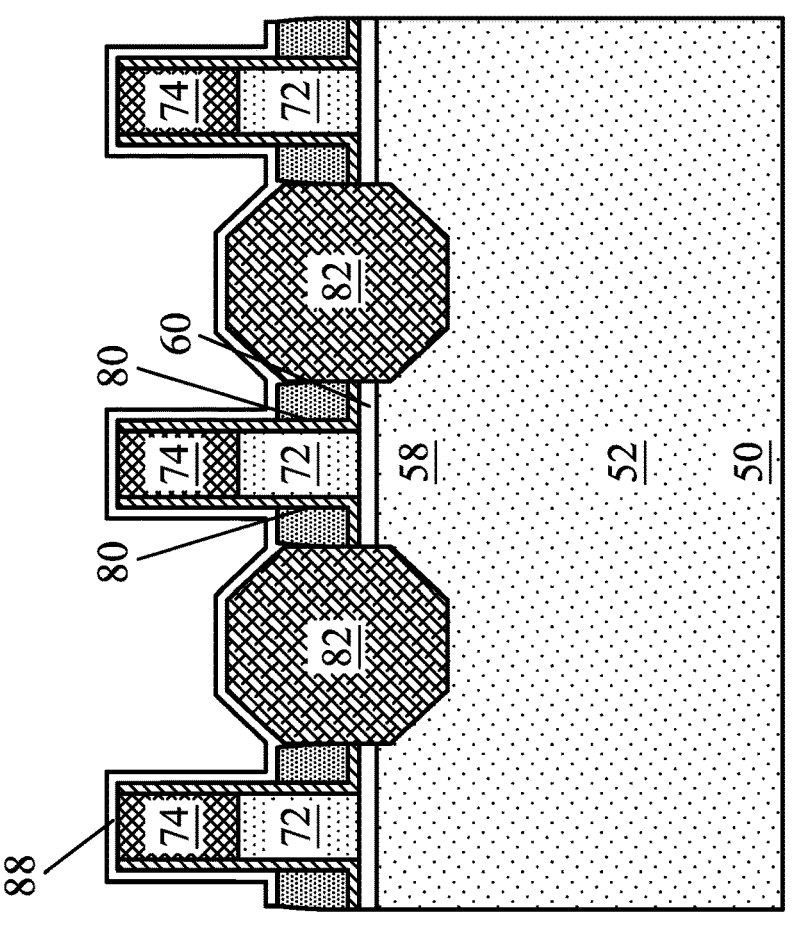
Figure 23A:
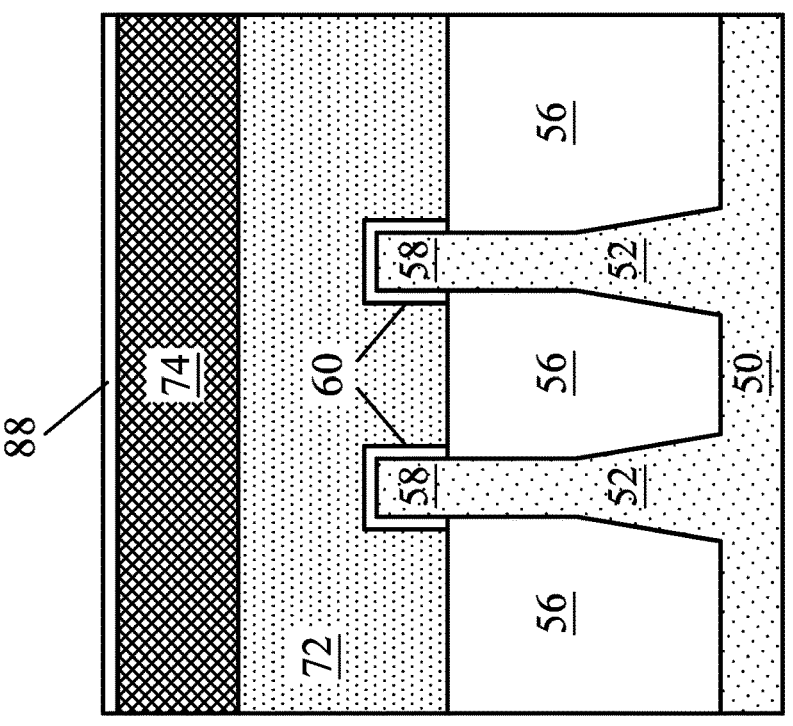

In FIGS. 23A and 23B, a protection layer 88 is formed over the gate structures, the gate seal spacers 80, the recessed gate spacers 86, and the source/drain regions 82. The protection layer 88 is similar to the protection layer 88 for the previously described embodiment and the description will not be repeated herein.

Figure 24B:
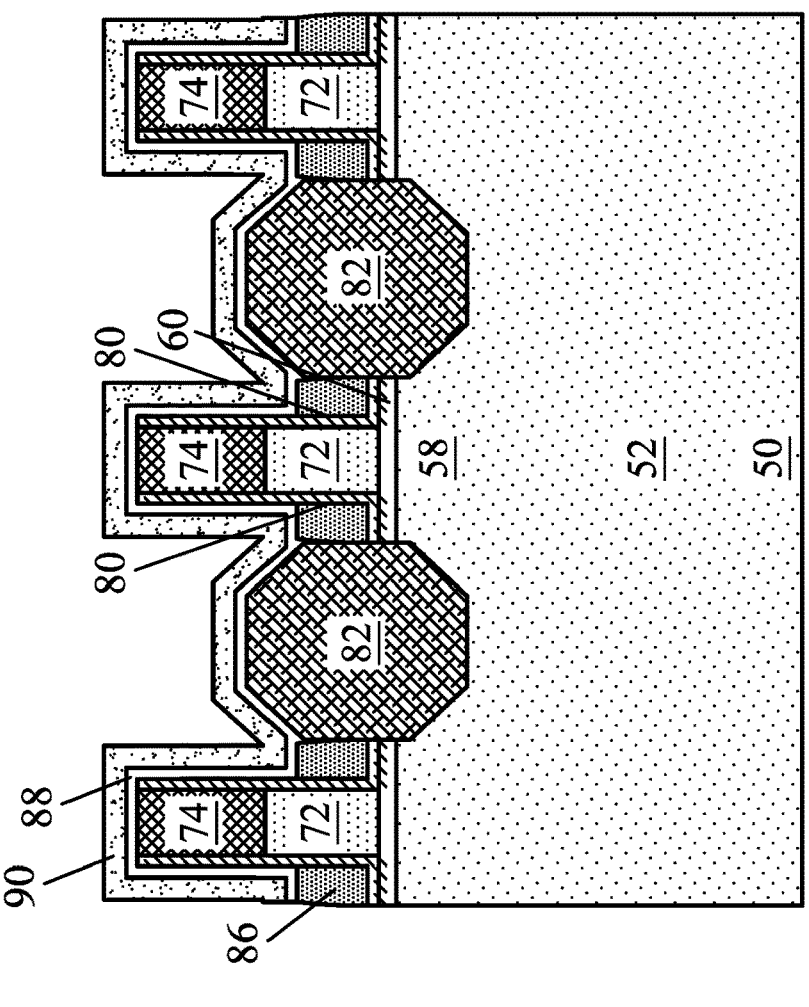
Figure 24A:
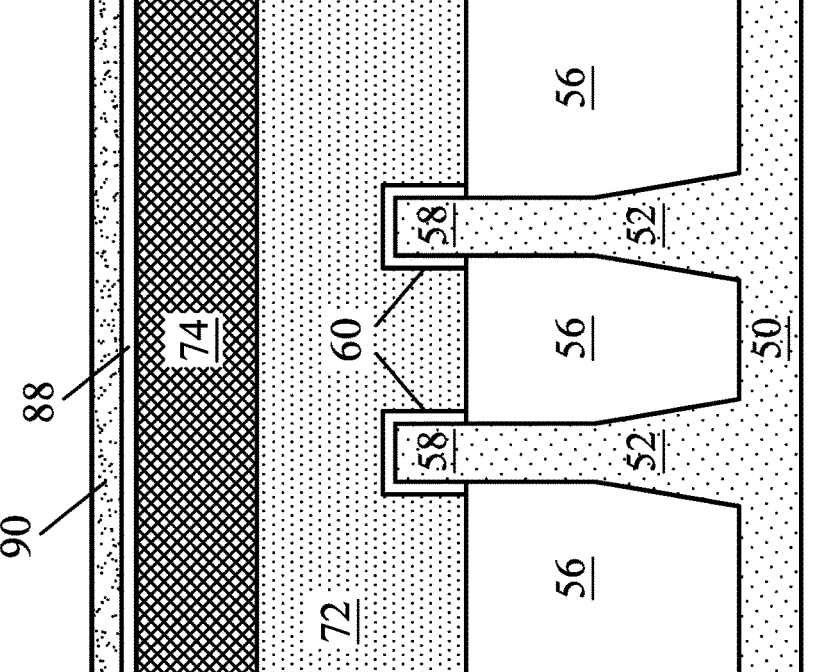

In FIGS. 24A and 24B, a replacement spacer layer 90 is formed over the protection layer 88. The replacement spacer layer 90 is similar to the replacement spacer layer 90 for the previously described embodiment and the description will not be repeated herein. In this embodiment, the replacement gate spacers 92 will include the protection layer 88, the replacement spacer layer 90, and the recessed gate spacers 86.

Figures 25A, 25B:
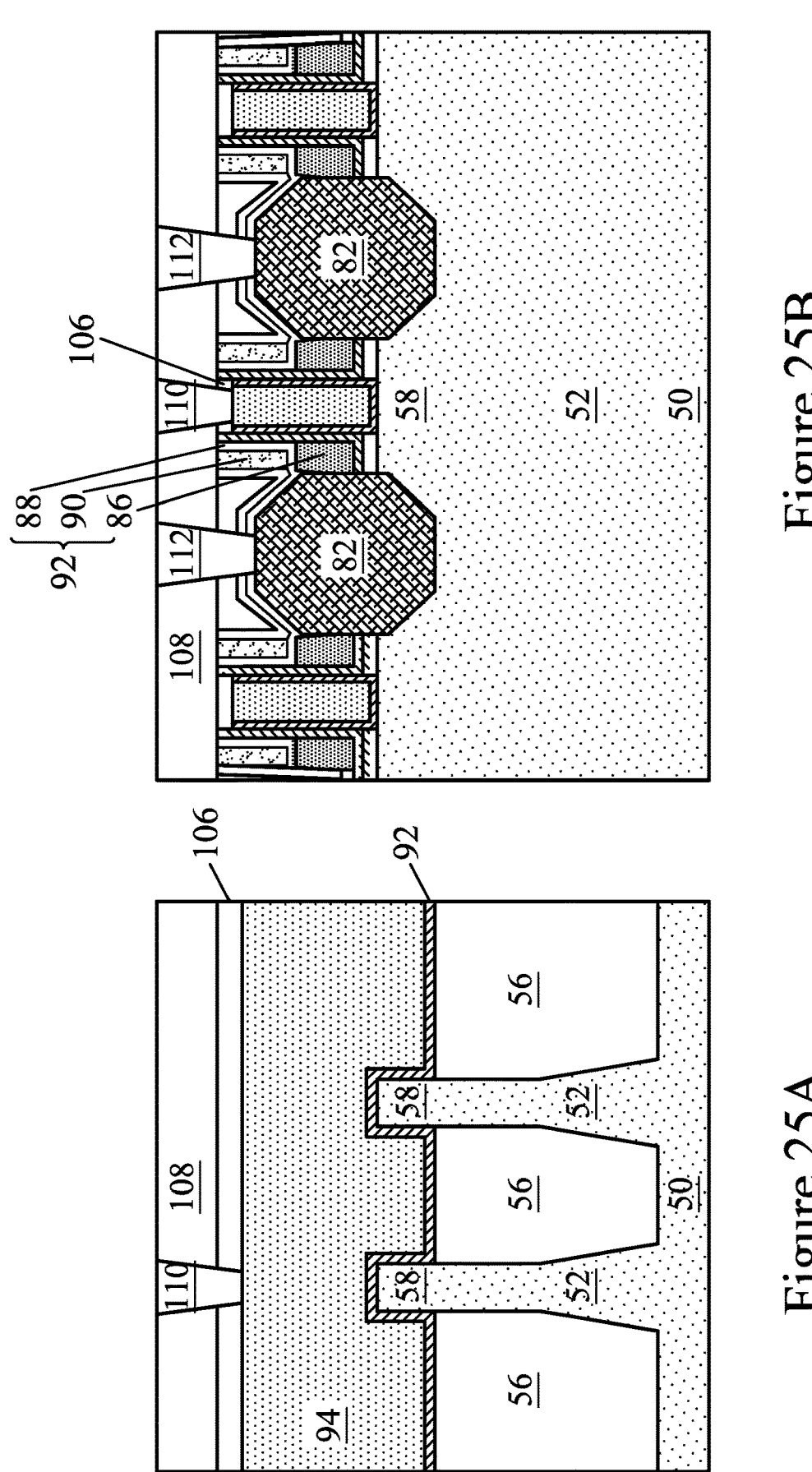

FIGS. 25A and 25B illustrate further processing on the structure of FIGS. 24A and 25B. The processing between these figures is similar to the processing illustrated and described above in reference to FIGS. 13A through 20B with FIGS. 25A and 25B being an equivalent intermediate stage as FIGS. 20A and 20B and the descriptions are not repeated herein.

FIGS. 26A through 30B illustrate another embodiment of forming replacement spacers 92. This embodiment is similar to the previous embodiment of FIGS. 2 through 20B except that in this embodiment, the replacement spacers 92 include a low-k spacer layer and an air spacer layer. Details regarding this embodiment that are similar to those for the previously described embodiment will not be repeated herein.

Figure 26B:
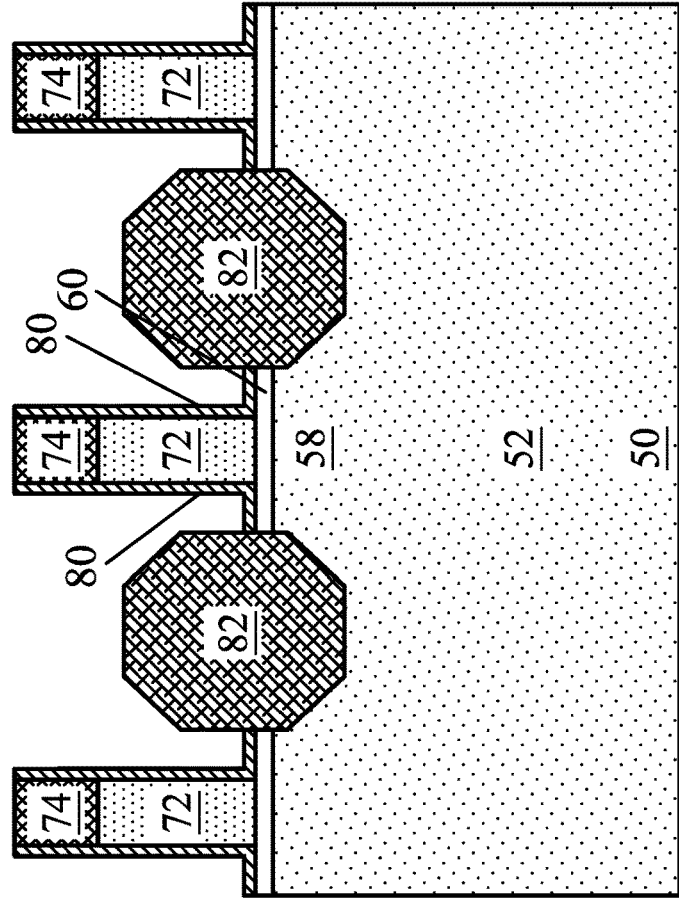
FIGS. 26A, 26B, 27A, 27B, 28A, 28B, 29A, 29B, 30A, and 30B are cross-sectional views of intermediate stages in the manufacturing of FinFETs, in accordance with some embodiments.
Figure 26A:
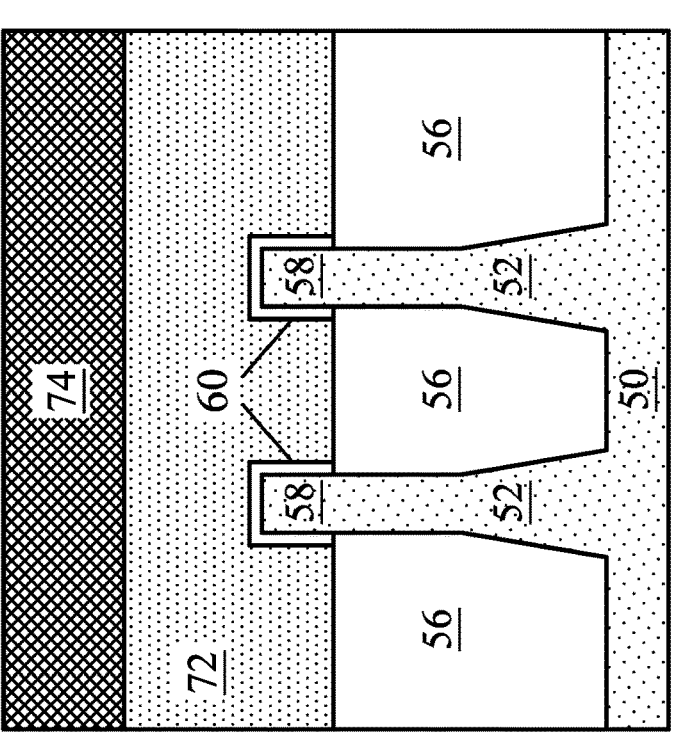

FIGS. 26A and 26B are an equivalent intermediate stage of processing as FIGS. 11A and 11B and the descriptions are not repeated herein.

Figure 27B:
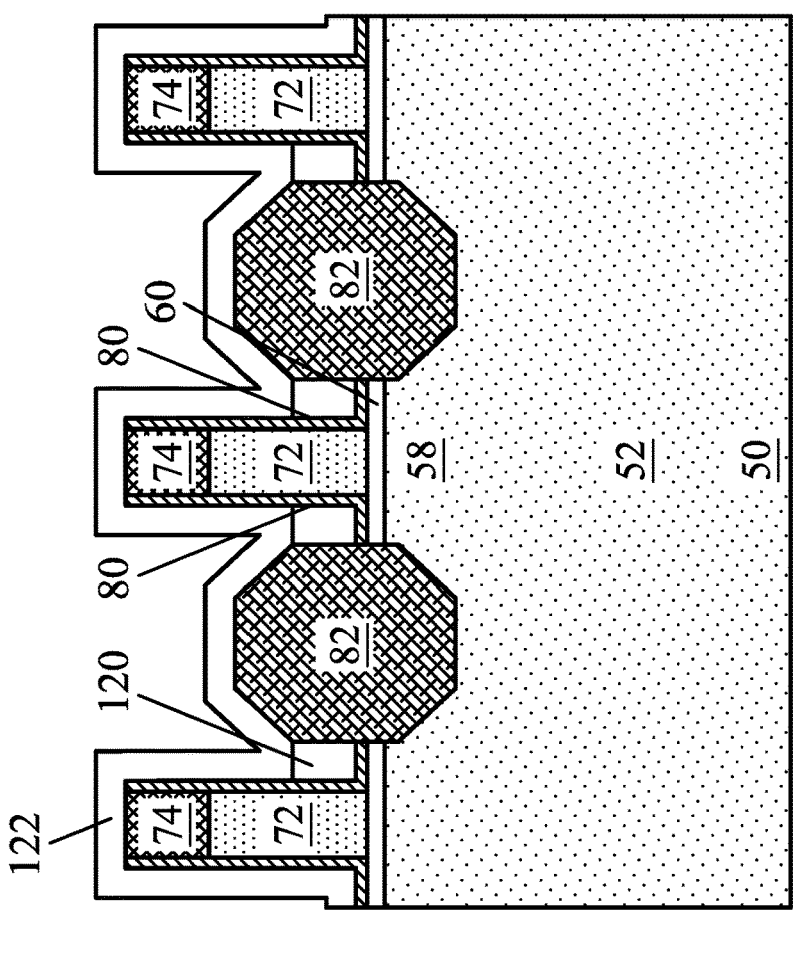
Figure 27A:
Figure 27A:
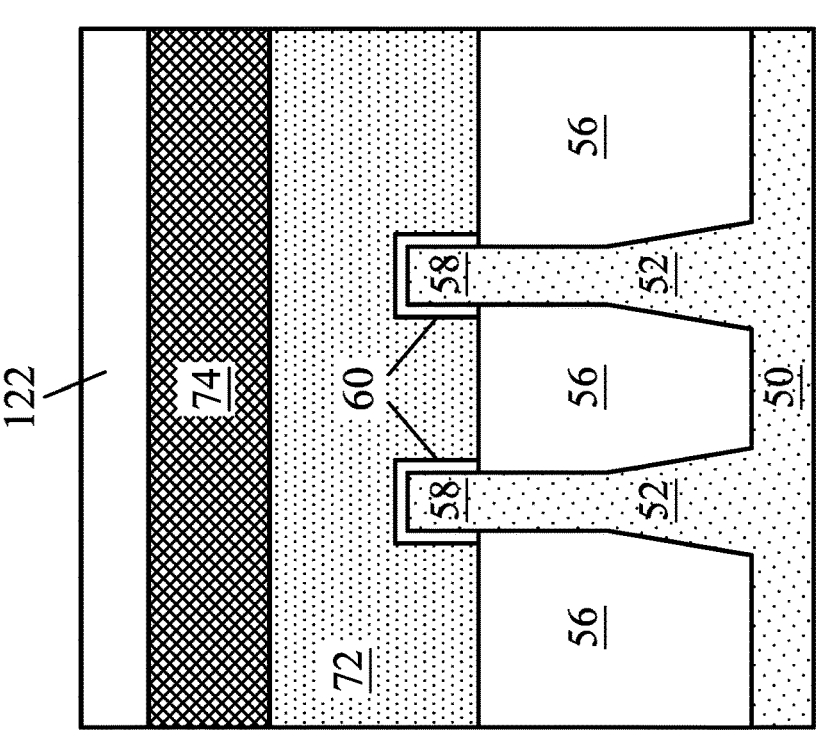

In FIGS. 27A and 27B, a replacement spacer layer 122 is formed over the gate seal spacers 80, the masks 74, and the source/drain regions 82. The replacement spacer layer 122 may be formed by conformally depositing an insulating material on the gate seal spacers 80, the masks 74, and the source/drain regions 82 such that air gaps 120 are formed between the source/drain regions 82 and the gate seal spacers 80 on sidewalls of the dummy gates 72. The replacement spacer layer 122 covers and seals the area between the source/drain regions 82 and the gate seal spacers 80 on sidewalls of the dummy gates 72 to form the air gaps 120. The replacement spacer layer 122 may be a low-k layer such as SiCN or the like. The replacement spacer layer 122 may be deposited by ALD, CVD, the like, or a combination thereof and may be formed to have a thickness from about 25 Angstroms to about 50 Angstroms.

In the ALD example, the process may be begun by introducing a silicon precursor such as hexachlorodisilane (HCD) (Si₂Cl₆), dichlorosilane (DCS) (Si₂H₄Cl₂), the like, or a combination thereof, a carbon precursor such as propene (C₃H₆), and a nitrogen precursor such as ammonia (NH₃) to the gate seal spacer layer 80. In an embodiment the silicon precursor is introduced at a flow rate of from about 300 seem to about 600 seem, such as about 450 seem, the carbon precursor is introduced at a flow rate from about 4000 seem to about 6000 seem, such as about 5000 seem, and the nitrogen precursor is introduced at a flow rate from about 3000 seem to about 6000 seem, such as about 4500 sccm. Further, the deposition may be performed at a temperature of from about 600° C. to about 700° C., such as about 630° C., and a pressure of between about 110 Pascal and about 4650 Pascal, such as about 530 Pascal. The deposition process for the gate seal spacer layer 80 can have a duration from 4 hours to 8 hours, such as about 6 hours. The replacement spacer layer 122 may be formed to have an atomic concentration of silicon in a range from about 40% to about 60%, such as about 50%; an atomic concentration of carbon in a range from about 5% to about 15%, such as about 10%; and an atomic concentration of nitrogen in a range from about 30% to about 40%, such as about 35%.

Figure 28B:
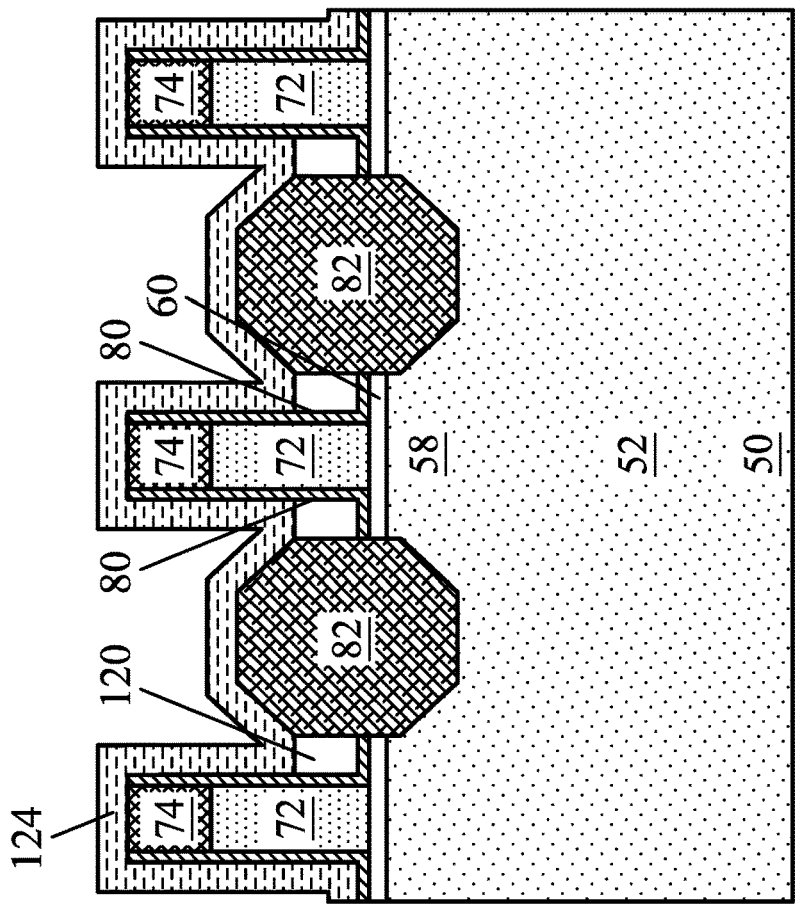
Figure 28A:
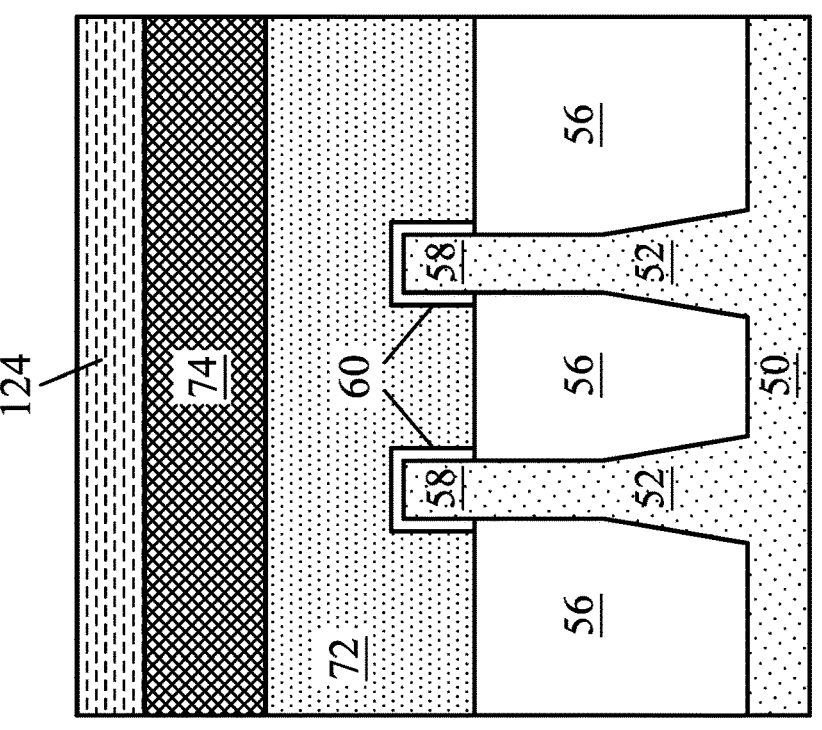

In FIGS. 28A and 28B, a treatment is performed on the replacement spacer layer 122 to form the treated replacement spacer layer 124. In some embodiments, the treatment is an oxidation process. In some embodiments, the oxidation treatment process is performed at a bias power from about 300 Watts to about 500 Watts, such as about 400 Watts; at a pressure from about 2 Pascal to about 6 Pascal, such as about 4 Pascal; at a temperature from about 30° C. to about 50° C., such as about 40° C. In some embodiments, the oxidation treatment process uses only reactive oxygen species (sometimes referred to as oxygen radicals). After the treatment, the treated replacement spacer layer 124 is composed of SiOCN. In some embodiments, the treated replacement spacer layer 124 has a k value of less than or equal to about 3.5.

Figure 29B:
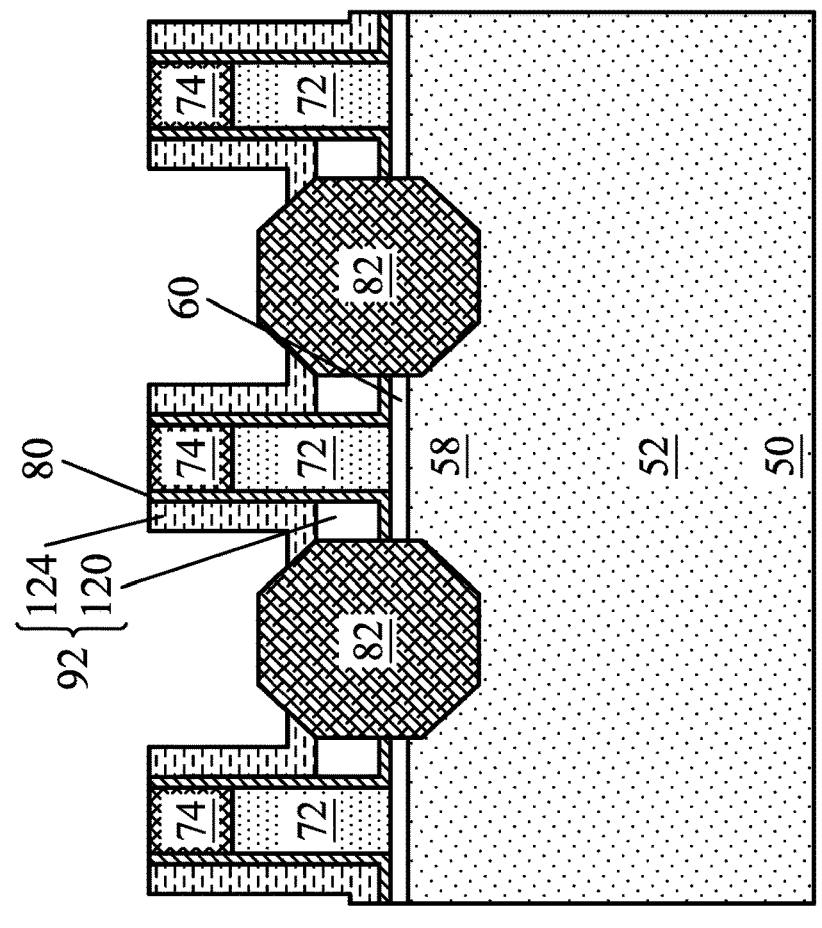
Figure 29A:
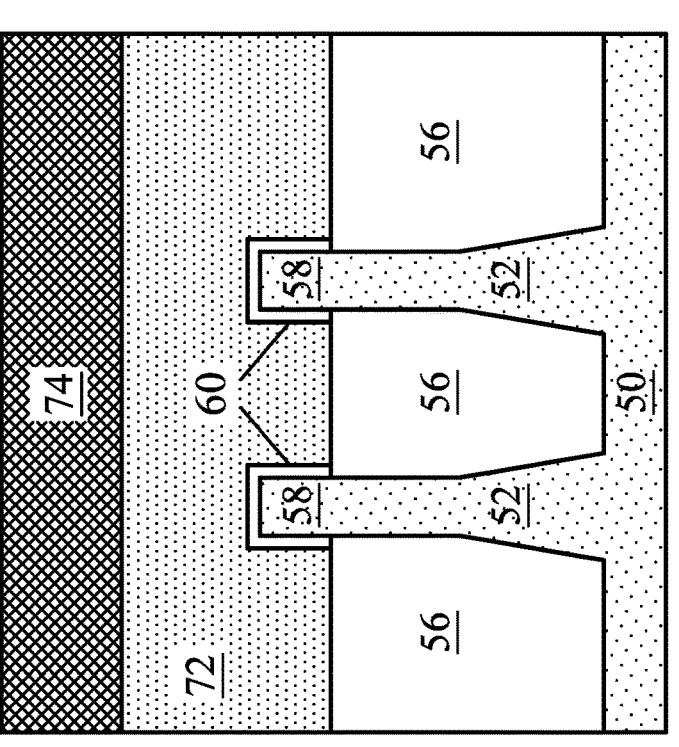

In FIGS. 29A and 29B, the treated replacement spacer layer 124 is removed from top surfaces of the masks 74 and the source/drain regions 82 to form replacement gate spacers 92. The treated replacement spacer layer 124 may be removed by an etching process, such as an anisotropic etching process to form the replacement gate spacers 92. The treated replacement spacer layer 124 and the air gaps 120 form the replacement gate spacers 92. The replacement gate spacers 92 may be formed from a low-k material and air gaps 120 and may be referred to as low-k gate spacers 92.

By having the replacement gate spacers 92 be formed of an air gap and low-k materials, performance of the FinFET devices can be improved due to the reduction in the capacitance between the gate and the source/drain regions of the devices. In addition, because oxygen is not introduced into the layer 122 until the source/drain regions 82 are covered by the layer 122, the oxygen does not cause damage to the source/drain regions 82, which would degrade performance of the devices.

Figures 30A, 30B:
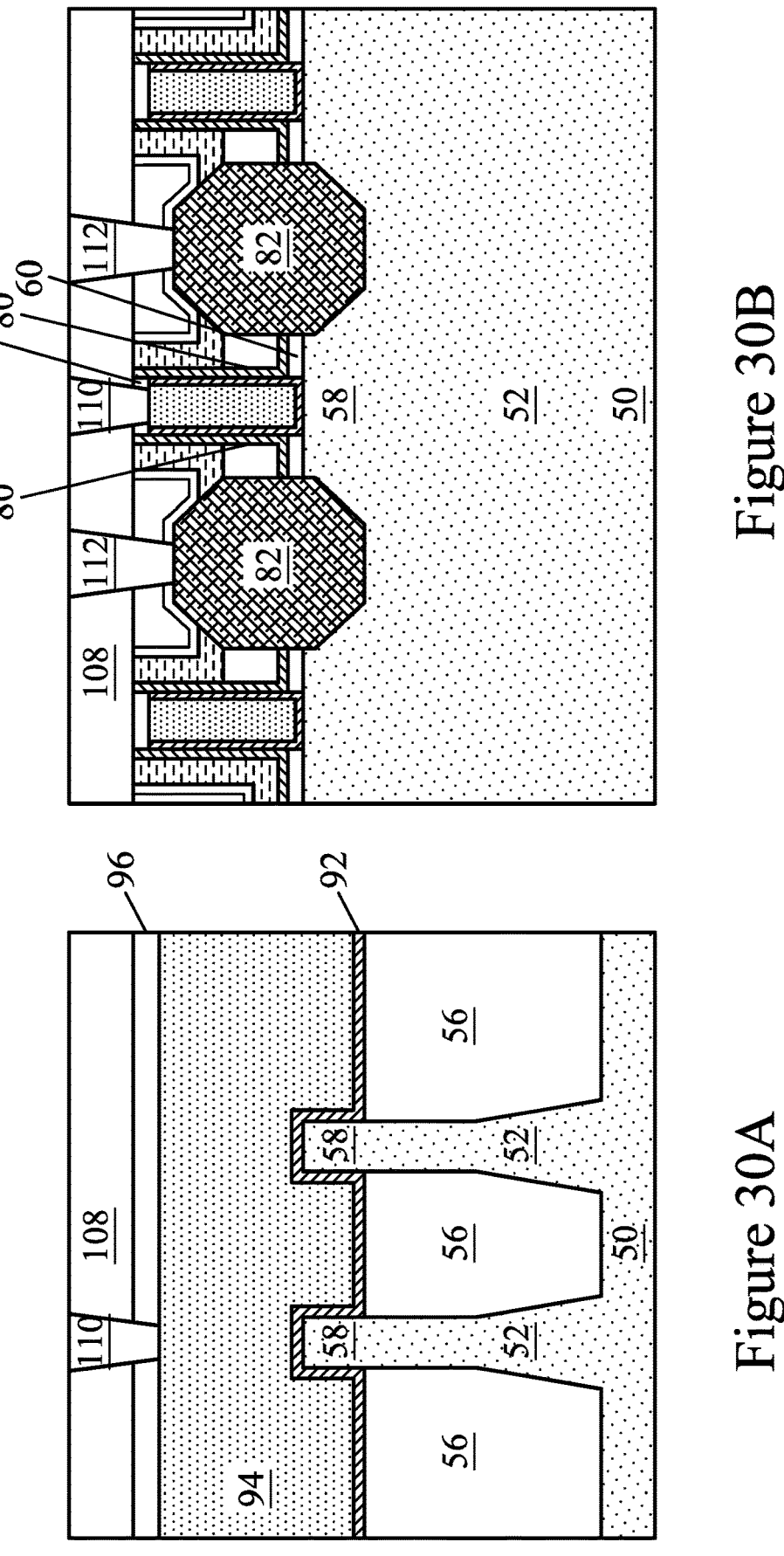

FIGS. 30A and 30B illustrate further processing on the structure of FIGS. 29A and 29B. The processing between these figures is similar to the processing illustrated and described above in reference to FIGS. 14A through 20B with FIGS. 30A and 30B being an equivalent intermediate stage as FIGS. 20A and 20B and the descriptions are not repeated herein.

FIGS. 31A through 35B illustrate another embodiment of forming replacement spacers 92. This embodiment is similar to the previous embodiments of FIGS. 26A through 30B except that in this embodiment, the replacement spacers 92 include a recessed gate spacer 86 instead of an air spacer layer. Details regarding this embodiment that are similar to those for the previously described embodiment will not be repeated herein.

Figure 31B:
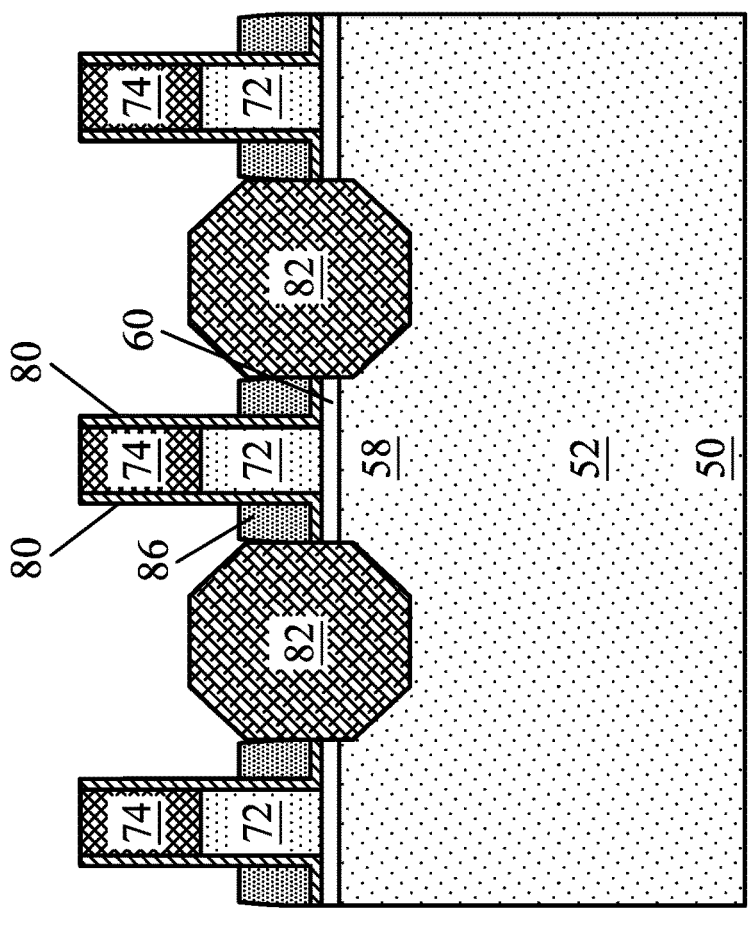
FIGS. 31A, 31B, 32A, 32B, 33A, 33B, 34A, 34B, 35A, and 35B are cross-sectional views of intermediate stages in the manufacturing of FinFETs, in accordance with some embodiments.
Figure 31A:
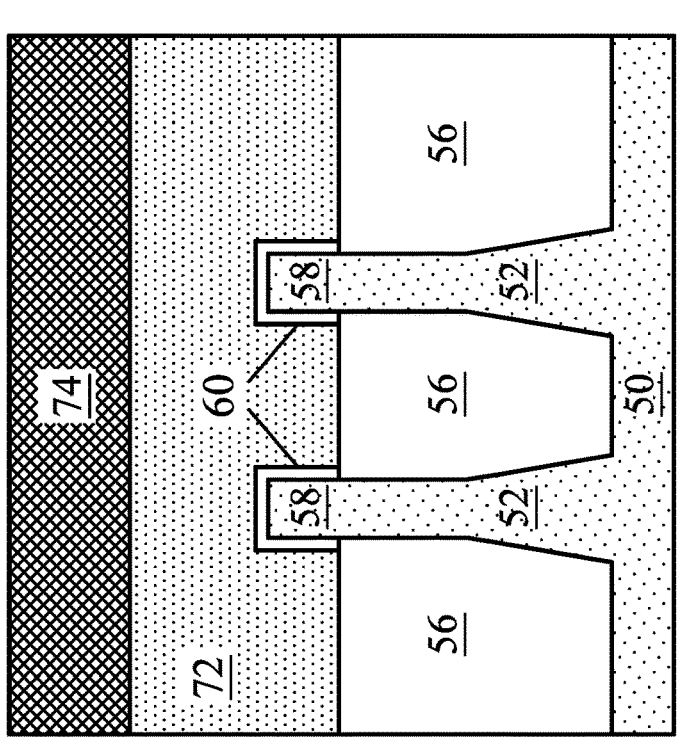

FIGS. 31A and 31B are an equivalent intermediate stage of processing as FIGS. 22A and 22B and the descriptions are not repeated herein.

Figure 32B:
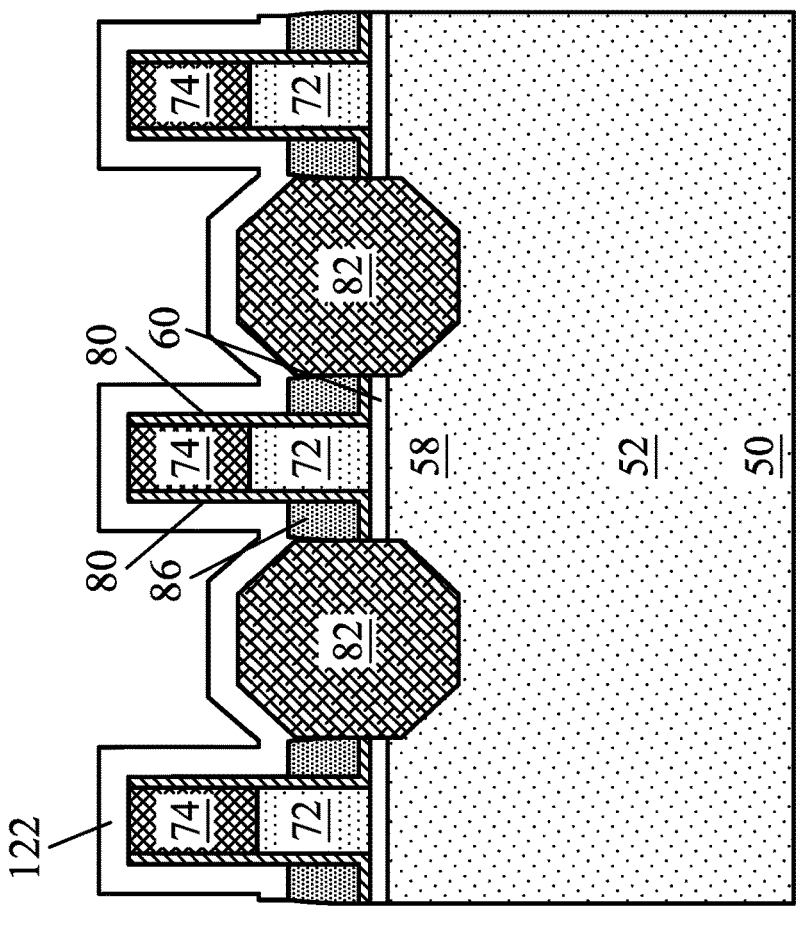
Figure 32A:
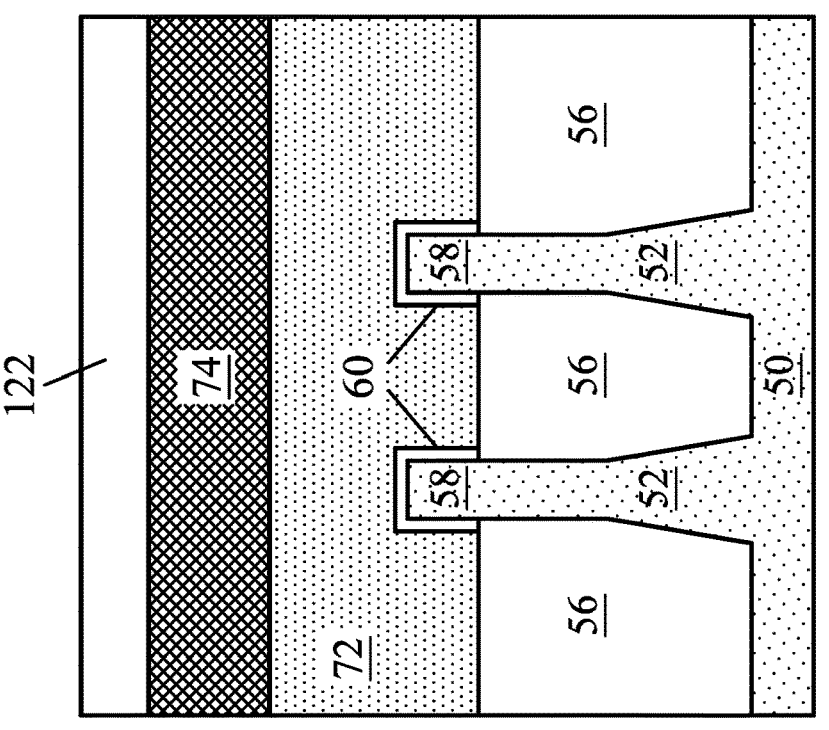

In FIGS. 32A and 32B, a replacement spacer layer 122 is formed over the gate structures, the gate seal spacers 80, the recessed gate spacers 86, and the source/drain regions 82. The replacement spacer layer 122 is similar to the replacement spacer layer 122 for the previously described embodiment and the description will not be repeated herein.

Figure 33B:
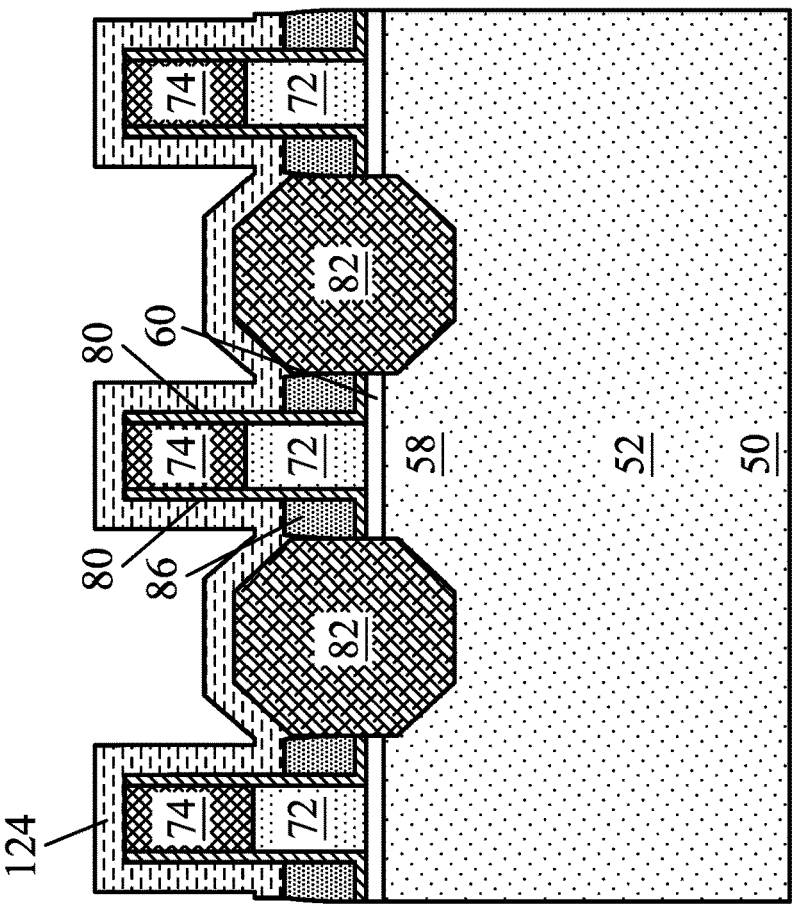
Figure 33A:
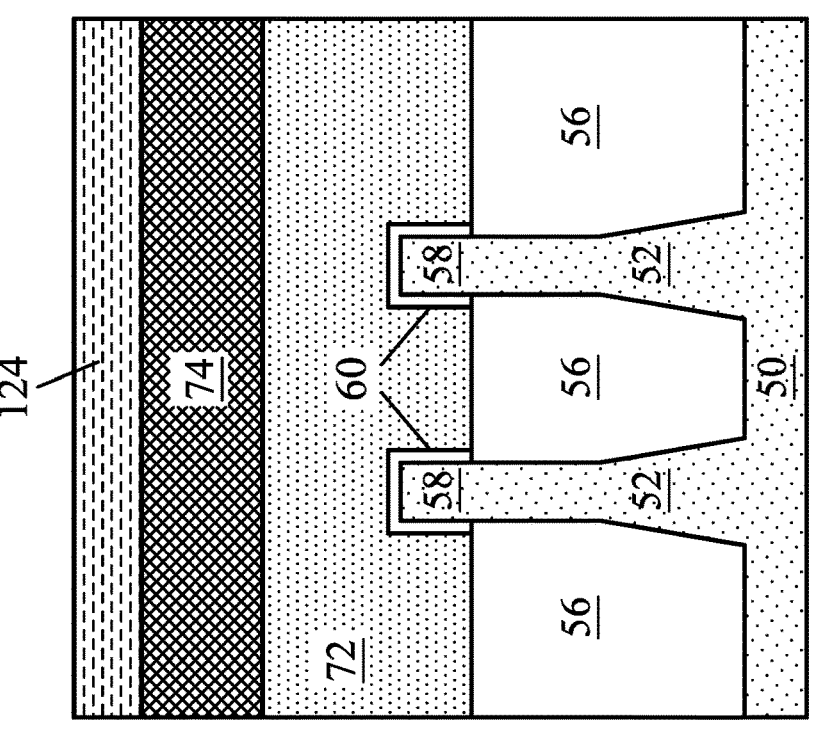

In FIGS. 33A and 33B, a treated replacement spacer layer 124 is formed. The treated replacement spacer layer 124 is similar to the treated replacement spacer layer 124 for the previously described embodiment and the description will not be repeated herein.

Figure 34B:
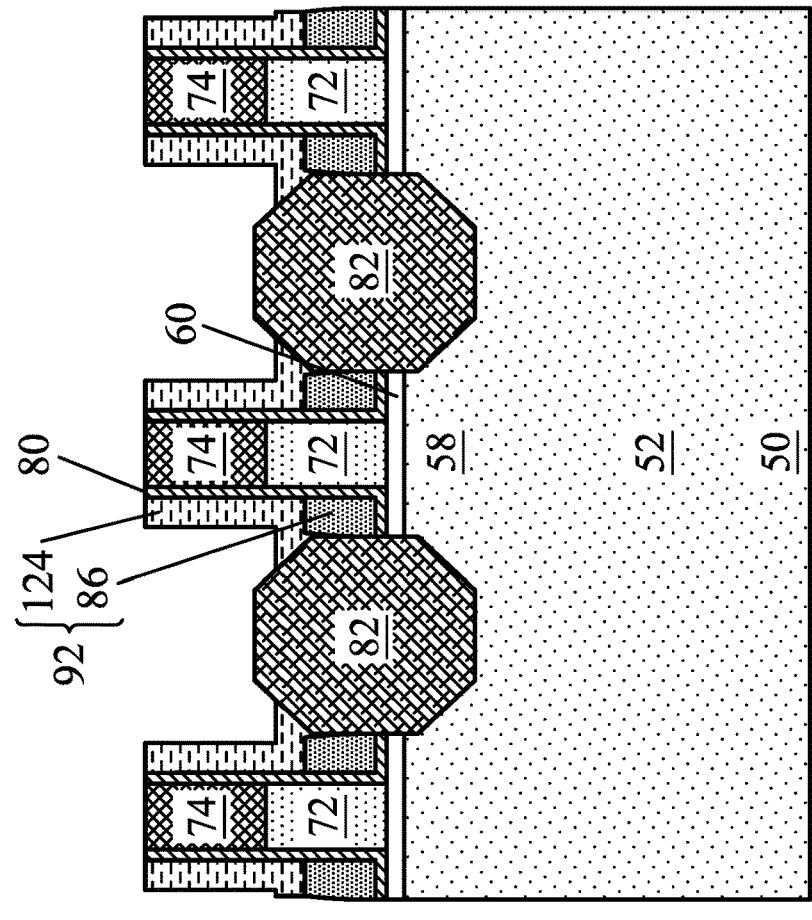
Figure 34A:
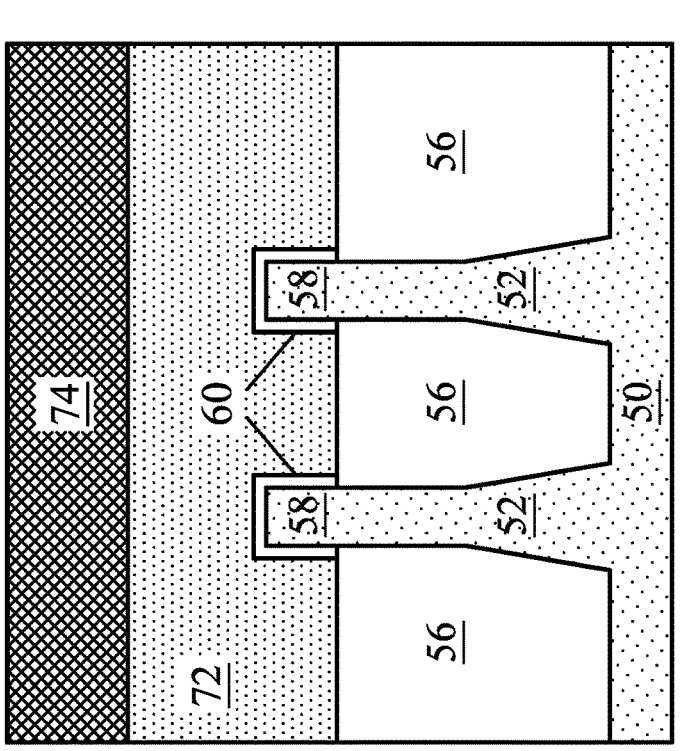

In FIGS. 34A and 34B, the treated replacement spacer layer 124 is patterned to form a replacement gate spacer 92 that includes the recessed gate spacer 86 and the treated replacement spacer layer 124. The patterning of the treated replacement spacer layer 124 is similar to the patterning of the treated replacement spacer layer 124 for the previously described embodiment and the description will not be repeated herein.

Figures 35A, 35B:
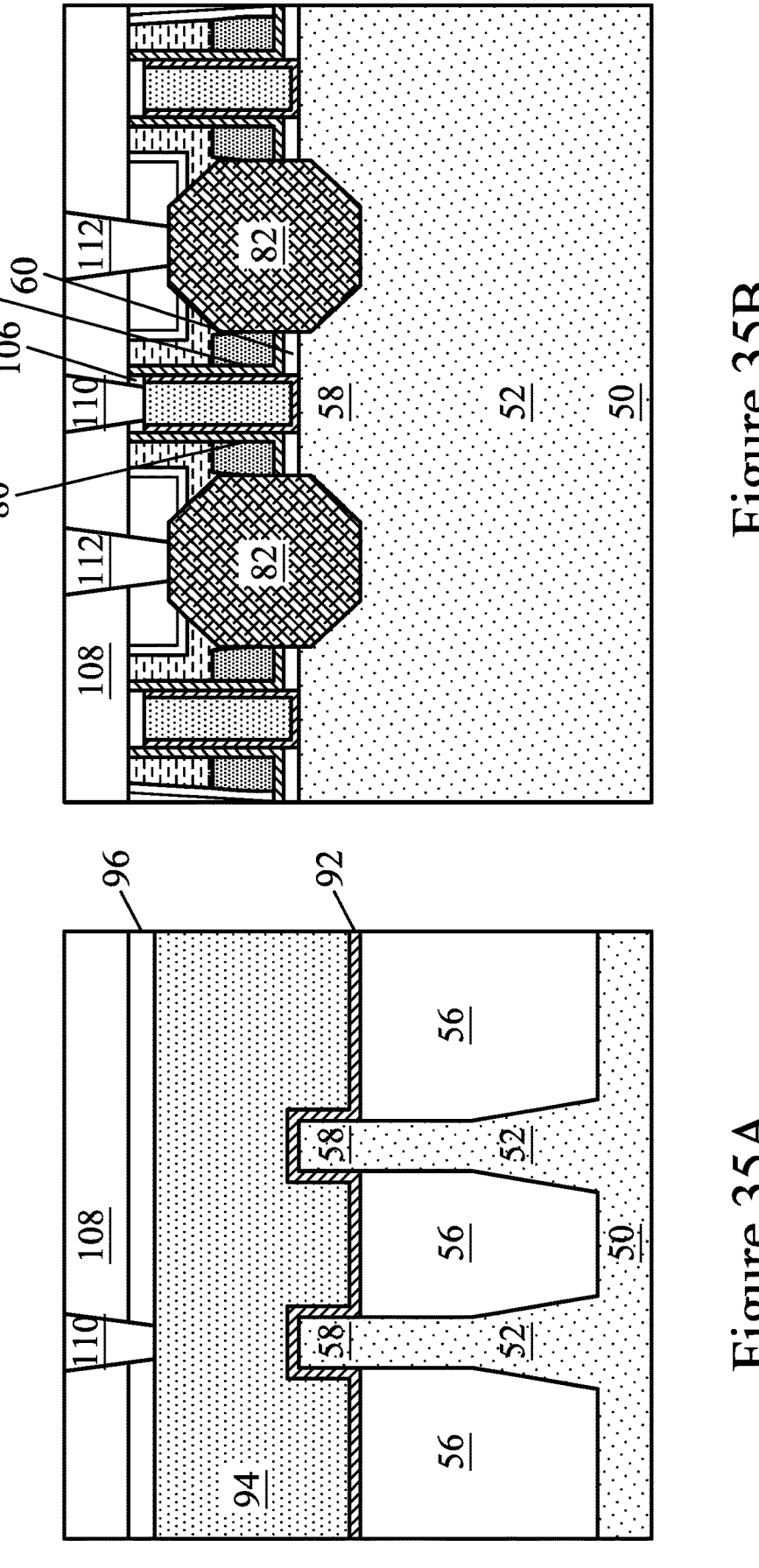

FIGS. 35A and 35B illustrate further processing on the structure of FIGS. 34A and 34B. The processing between these figures is similar to the processing illustrated and described above in reference to FIGS. 13A through 20B with FIGS. 35A and 35B being an equivalent intermediate stage as FIGS. 20A and 20B and the descriptions are not repeated herein.

By having the replacement gate spacers 92 be formed of low-k materials, performance of the FinFET devices can be improved due to the reduction in the capacitance between the gate and the source/drain regions of the devices. In addition, the protection layer 88 enables the reduced capacitance without causing damage to the source/drain regions 82, which would degrade performance of the devices. In particular, the source/drain regions 82 are epitaxial structures and the spacers 92 formed on sidewalls of the gate electrodes are formed as low-k spacers to reduce the capacitance between the gate electrodes and the source/drain regions 82. The protection layer protects the source/drain regions and prevents them from being damaged during the formation of the low-k spacers 92.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first semiconductor fin;
   forming a first gate stack over and along sidewalls of the first semiconductor fin, the first gate stack comprising a gate dielectric layer and a gate electrode layer;
   forming a first gate seal spacer on a sidewall of the first gate stack;
   forming a first epitaxial source/drain region in the first semiconductor fin;
   forming a protection layer on the first gate seal spacer and on a top surface of the first epitaxial source/drain region;
   forming a first gate spacer on the protection layer;
   patterning the protection layer and the first gate spacer to expose the first epitaxial source/drain region, wherein after patterning, the protection layer is between the first epitaxial source/drain region and the first gate spacer, and the protection layer is between the first gate spacer and the first gate stack; and
   replacing the first gate stack with a second gate stack.

2. The method of claim 1, wherein the first gate spacer comprises a low-k dielectric material.

3. The method of claim 2, wherein the low-k dielectric material comprises silicon oxycarbonitride (SiOCN), silicon carbide (SiC), or carbon-doped oxide (CDO).

4. The method of claim 1, wherein forming the first gate spacer on the protection layer comprises:
   forming a first layer of a low-k dielectric material; and
   forming a second layer comprising a material with a different dielectric constant than the low-k dielectric material.

5. The method of claim 4, wherein the material of the second layer comprises silicon nitride, silicon oxynitride, or combinations thereof.

6. The method of claim 1, further comprising:
   forming an etch stop layer over the first gate stack, the first gate spacer, and the first epitaxial source/drain region;
   forming a first dielectric layer over the etch stop layer;
   after replacing the first gate stack with the second gate stack, forming a second dielectric layer over the second gate stack and the first dielectric layer; and
   forming a conductive contact through the first and second dielectric layers to the first epitaxial source/drain region.

7. The method of claim 6, wherein the etch stop layer physically contacts the protection layer, and wherein the protection layer physically contacts the first epitaxial source/drain region.

8. The method of claim 1, wherein the protection layer is an insulating layer and physically contacts the first epitaxial source/drain region.

9. The method of claim 1, wherein forming the protection layer comprises depositing silicon carbonitride without using an oxygen precursor.

10. The method of claim 1, wherein the first gate spacer comprises silicon oxycarbonitride and has a dielectric constant less than or equal to 3.5.

11. The method of claim 1, wherein the protection layer has a thickness from 10 Angstroms to 20 Angstroms.

12. A method comprising:

forming a first semiconductor fin;

forming a first gate stack over and along sidewalls of the first semiconductor fin;

forming a first gate seal spacer along a sidewall of the first gate stack;

forming a first source/drain region in the first semiconductor fin;

forming a first spacer footing over the first gate seal spacer;

conformally forming a protection layer on the first gate seal spacer and the first spacer footing; and forming a first gate spacer over the protection layer and the first spacer footing, the first spacer footing being between the first gate seal spacer and the first source/ drain region, wherein the first spacer footing comprises SiOCN, wherein the first spacer footing has a different material composition than the first gate spacer.

13. The method of claim 12, wherein forming the first spacer footing over the first gate seal spacer comprises:

forming a first gate spacer along the sidewall of the first gate stack; and etching the first gate spacer.

14. The method of claim 12, wherein forming the first gate spacer over the protection layer and the first spacer footing comprises:

forming a dielectric layer over the first gate stack, the first gate spacer footing, and the first source/drain region;

performing a treatment on the dielectric layer; and etching the treated dielectric layer to form the first gate spacer.

15. The method of claim 12, wherein the first gate spacer comprises SiOCN.

16. The method of claim 12, wherein the first gate spacer physically contacts the first source/drain region.

17. A method comprising:

forming a first fin over a substrate;

forming a first gate stack over and along sidewalls of the first fin, the first gate stack comprising a gate dielectric layer and a gate electrode layer;

forming a first gate seal spacer on sidewalls of the first gate stack;

forming a protection layer on and directly contacting the first gate seal spacer;

forming a first gate spacer on and directly contacting the protection layer, the protection layer being between the first gate spacer and the first gate stack, the first gate spacer comprising a low-k dielectric material; and forming a first source/drain region on the first fin and adjacent the first gate spacer, the protection layer being between the first source/drain region and the first gate spacer.

18. The method of claim 17, further comprising:

forming an etch stop layer over the first source/drain region, the protection layer physically contacting the etch stop layer.

19. The method of claim 17, further comprising:

forming a first spacer footing under the protection layer, the first spacer footing being between the first gate seal spacer and the first source/drain region, the protection layer extending over the first source/drain region.

20. The method of claim 19, wherein the first spacer footing has a different material composition than the first gate spacer.

* * * * *